United States Patent [19]

McClure et al.

[11] Patent Number: 5,706,232
[45] Date of Patent: *Jan. 6, 1998

[54] SEMICONDUCTOR MEMORY WITH MULTIPLE CLOCKING FOR TEST MODE ENTRY

[75] Inventors: David Charles McClure, Carrollton; Thomas Allyn Coker, Irving, both of Tex.

[73] Assignee: SGS-Thomson Microelectronics, Inc., Carrollton, Tex.

[*] Notice: The term of this patent shall not extend beyond the expiration date of Pat. No. 5,161,159.

[21] Appl. No.: 424,722

[22] Filed: Apr. 18, 1995

Related U.S. Application Data

[63] Continuation of Ser. No. 984,233, Nov. 20, 1992, Pat. No. 5,408,435, which is a continuation of Ser. No. 570,148, Aug. 17, 1990, abandoned.

[51] Int. Cl.$^6$ .................. G11C 29/00; G06F 11/00
[52] U.S. Cl. .................. 365/201; 365/195; 371/21.1; 371/22.1
[58] Field of Search .................. 365/201, 195, 365/226, 227; 371/22.1, 66; 326/16, 21, 37; 327/143

[56] References Cited

U.S. PATENT DOCUMENTS

| | | | |
|---|---|---|---|
| 4,104,734 | 8/1978 | Herndon | 365/228 |
| 4,398,146 | 8/1983 | Draheim | 324/158 |
| 4,507,761 | 3/1985 | Graham | 365/233 |
| 4,587,640 | 5/1986 | Saitoh | 365/226 |
| 4,631,707 | 12/1986 | Watanabe | 365/226 |
| 4,654,849 | 3/1987 | White, Jr. et al. | 371/21.1 |
| 4,734,880 | 3/1988 | Collins | 305/233 |
| 4,755,964 | 7/1988 | Miner | 365/233 |
| 4,771,407 | 9/1988 | Takemae et al. | 365/226 |
| 4,777,626 | 10/1988 | Matsushita | 365/226 |

(List continued on next page.)

FOREIGN PATENT DOCUMENTS

| | | | |
|---|---|---|---|
| 0209982 | 6/1986 | European Pat. Off. | |
| 0317014 | 11/1988 | European Pat. Off. | |
| 61-247984 | 3/1987 | Japan | |
| 2221072 | 1/1990 | United Kingdom | |
| 0000912 | 11/1979 | WIPO | 365/226 |
| 7900912 | 11/1979 | WIPO | |
| 8204345 | 12/1982 | WIPO | 365/226 |

OTHER PUBLICATIONS

McAdams, et al., "A 1-Mbit CMOS Dynamic RAM With Design-For Test Functions", *IEEE Journal of Solid-State Circuits*(Oct. 1986), vol. SC-21, No. 5, pp. 635–642.

Shimada, et al., "A 46-ns 1-Mbit CMOS SRAM", *IEEE Journal of Solid-State Circuits* (Feb. 1988), vol. 23, No. 1, pp. 53–58.

*Primary Examiner*—Jack A. Lane
*Attorney, Agent, or Firm*—Theodore E. Galanthay; Lisa K. Jorgenson; Christopher F. Regan

[57] ABSTRACT

An integrated circuit having a normal operating mode and a special operating mode, such as a special test mode, is disclosed. The special test mode is enabled by a series of signals, such as overvoltage excursions at a terminal, rather than by a single such excursion, so that it is less likely that the special test mode is entered inadvertently, such as due to noise or power-down and power-up of the device. The circuit for enabling the test mode includes a series of D-type flip-flops, each of which are clocked upon detection of the overvoltage condition together with a particular logic level applied at another terminal; multiple series of flip-flops may be provided for multiple special test modes. Additional features include the provision of a power-on reset circuit which locks out the entry into the test mode during power-up of the device. Acknowledgment of the entry into test mode is provided by the presentation of a low impedance at output terminals while the device is not enabled; chip enable of the device causes the device to exit the test mode. Once in test mode, the output enable terminal of the device can provide a chip enable function.

17 Claims, 8 Drawing Sheets

U.S. PATENT DOCUMENTS

| | | | |
|---|---|---|---|
| 4,812,675 | 3/1989 | Goetting | 307/443 |
| 4,841,233 | 6/1989 | Yoshida | 324/158 |
| 4,855,621 | 8/1989 | Hoffman et al. | 371/21.1 |
| 4,860,259 | 8/1989 | Tobita | 365/201 |
| 4,933,902 | 6/1990 | Yamada et al. | 365/226 |
| 4,937,789 | 6/1990 | Matsubara | 365/226 |
| 4,942,319 | 7/1990 | Pickett et al. | 307/465 |
| 4,956,818 | 9/1990 | Hatayana et al. | 365/189.08 |
| 4,970,727 | 11/1990 | Miyawaki et al. | 371/21.4 |
| 4,975,883 | 12/1990 | Butice et al. | 365/226 |
| 4,987,325 | 1/1991 | Seo | 307/465 |
| 4,996,672 | 2/1991 | Kim | 365/225.7 |
| 5,016,219 | 5/1991 | Nolan et al. | 365/288 |
| 5,019,772 | 5/1991 | Dreibelbis | 371/22.1 |
| 5,036,272 | 7/1991 | Cho | 371/22.1 |
| 5,036,495 | 7/1991 | Busch et al. | 365/233 |
| 5,047,987 | 9/1991 | Kosage | 365/228 |
| 5,072,138 | 12/1991 | Slemmer et al. | 307/465 |
| 5,130,645 | 7/1992 | Levy | 324/158 |

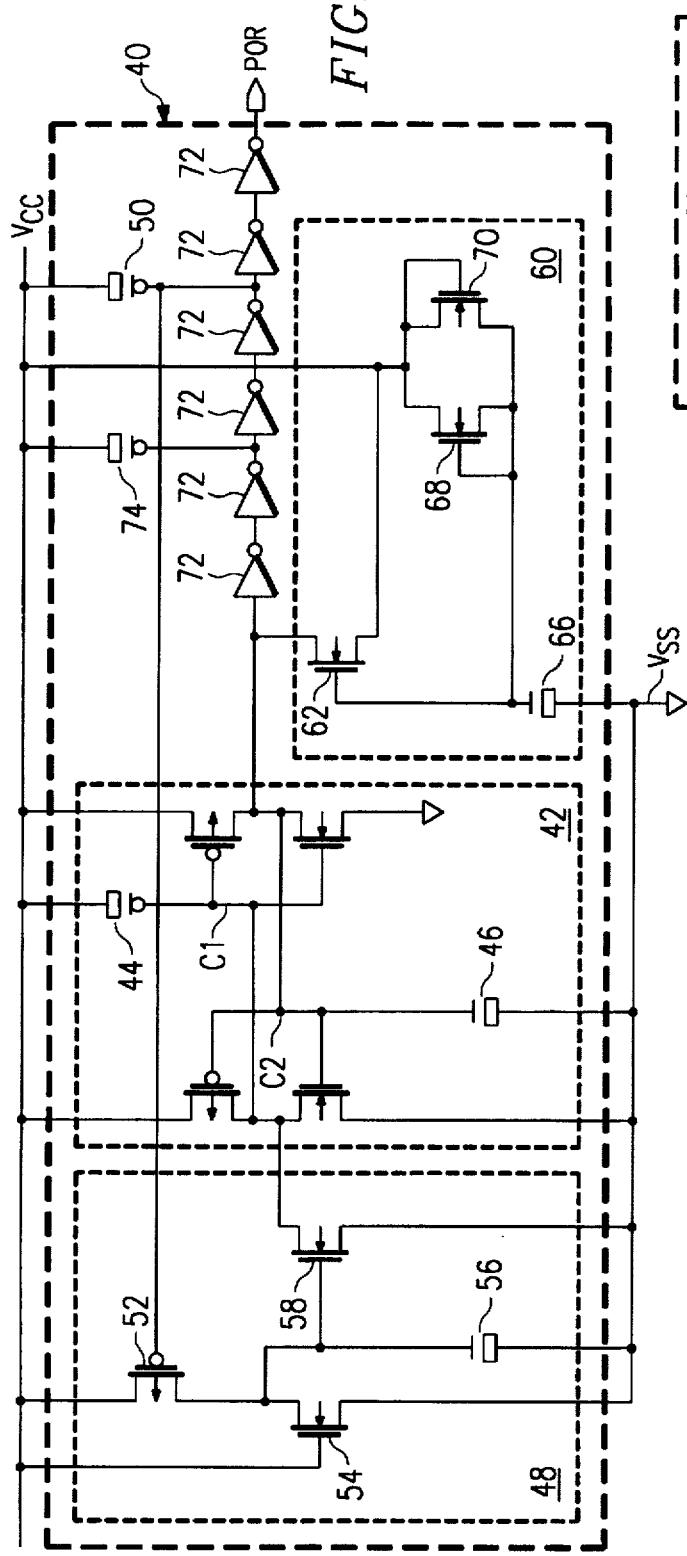

SEMICONDUCTOR MEMORY WITH MULTIPLE CLOCKING FOR TEST MODE ENTRY

The present application is a continuation of application Ser. No. 07/984,233, filed Nov. 20, 1992, issued Apr. 18, 1995 as U.S. Pat. No. 5,408,435, which is a continuation of application Ser. No. 07/570,148, filed Aug. 17, 1990, abandoned.

This application is also related to application Ser. No. 552,567 filed Jul. 13, 1990 (now U.S. Pat. No. 5,265,100 issued Nov. 23, 1993), incorporated herein by reference. This application is also related to applications Ser. No. 569,009 (now U.S. Pat. No. 5,072,137 issued Dec. 10, 1991), Ser. No. 568,968 (now U.S. Pat. No. 5,161,159 issued Nov. 3, 1992), Ser. No. 569,000 (now U.S. Pat. No. 5,115, 146 issued May 19, 1992), Ser. No. 570,149 (now U.S. Pat. No. 5,134,587 issued Jul. 28, 1992), Ser. No. 569,002 (now U.S. Pat. No. 5,134,586 issued Jul. 28, 1992), and Ser. No. 570,124 (now U.S. Pat. No. 5,299,203 issued Mar. 29, 1994), all contemporaneously filed with this application. All of these applications are assigned to SGS-Thomson Microelectronics, Inc.

This invention is in the field of semiconductor memories, and is specifically directed to the entry into special test modes for such memories.

BACKGROUND OF THE INVENTION

In modern high density memories, such as random access memories having $2^{20}$ bits (1 Megabit) or more, the time and equipment required to test functionality and timing of all bits in the memory constitutes a significant portion of the manufacturing cost. Accordingly, as the time required for such testing increases, the manufacturing costs also increase. Similarly, if the time required for the testing of the memory can be reduced, the manufacturing cost of the memories is similarly reduced. Since the manufacturing of memory devices is generally done in high volume, the savings of even a few seconds per device can result in significant cost reduction and capital avoidance, considering the high volume of memory devices produced.

Random access memories (RAMs) are especially subject to having significant test costs, not only because of the necessity of both writing data to and reading data from each of the bits in the memory, but also because RAMs are often subject to failures due to pattern sensitivity. Pattern sensitivity failures arise because the ability of a bit to retain its stored data state may depend upon the data states stored in, and the operations upon, bits which are physically adjacent to a particular bit being tested. This causes the test time for RAMs to be not only linearly dependent upon its density (i.e, the number of bits available for storage) but, for some pattern sensitivity tests, dependent upon the square (or 3/2 power) of the number of bits. Obviously, as the density of RAM devices increases (generally by a factor of four, from generation to generation), the time required to test each bit of each device in production increases at a rapid rate.

It should be noted that many other integrated circuit devices besides memory chips themselves utilize memories on-chip. Examples of such integrated circuits include many modern microprocessors and microcomputers, as well as custom devices such as gate arrays which have memory embedded therewithin. Similar cost pressures are faced in the production of these products as well, including the time and equipment required for testing of the memory portions.

A solution which has been used in the past to reduce the time and equipment required for the testing of semiconductor memories such as RAMs is the use of special "test" modes, where the memory enters a special operation different from its normal operation. In such test modes, the operation of the memory can be quite different from that of normal operation, as the operation of internal testing can be done without being subject to the constraints of normal operation.

An example of a special test mode is an internal "parallel", or multi-bit, test mode. Conventional parallel test modes allow access to more than one memory location in a single cycle, with common data written to and read from the multiple locations simultaneously. For memories which have multiple input/output terminals, multiple bits would be accessed in such a mode for each of the input/output terminals, in order to achieve the parallel test operation. This parallel test mode of course is not available in normal operation, since the user must be able to independently access each bit in order to utilize the full capacity of the memory. Such parallel testing is preferably done in such a way so that the multiple bits accessed in each cycle are physically separated from one another, so that there is little likelihood of pattern sensitivity interaction among the simultaneously accessed bits. A description of such parallel testing may be found in McAdams et al., "A 1-Mbit CMOS Dynamic RAM With Design-For-Test Functions", *IEEE Journal of Solid-State Circuits*, Vol SC-21, No. 5 (October 1986), pp. 635–642.

Other special test modes may be available for particular memories. Examples of tests which may be performed in such modes include the testing of memory cell data retention times, tests of particular circuits within the memory such as decoders or sense amplifiers, and the interrogation of certain portions of the circuit to determine attributes of the device such as whether or not the memory has had redundant rows or columns enabled. The above-referenced article by McAdams et al. describes these and other examples of special test functions.

Of course, when the memory device is in such a special test mode, it is not operating as a fully randomly accessible memory. As such, if the memory is in one of the test modes by mistake, for example when installed in a system, data cannot be stored and retrieved as would be expected for such a memory. For example, when in parallel test mode, the memory writes the same data state to a plurality of memory locations. Accordingly, when presented with an address in parallel test mode, the memory will output a data state which does not depend solely on the stored data state, but may also depend upon the results of the parallel comparison. Furthermore, the parallel test mode necessarily reduces the number of independent memory locations to which data can be written and retrieved, since four, or more, memory locations are simultaneously accessed. It is therefore important that the enabling of the special test modes be accomplished in such a manner that the chance is low that a special test mode will be inadvertently entered.

Prior techniques for entry into special test mode include the use of a special terminal for indicating the desired operation. A simple prior technique for the entry into test mode is the presentation of a logic level, high or low, at a dedicated terminal to either select the normal operation mode or a special test mode such as parallel test, as described in U.S. Pat. No. 4,654,849. Another approach for the entry into test mode using such a dedicated terminal is disclosed in Shimada et al., "A 46-ns 1-Mbit CMOS SRAM", *IEEE Journal of Solid-State Circuits*, Vol. 23, No. 1, (February 1988) pp. 53–58, where a test mode is enabled by the application of a high voltage to a dedicated control pad while performing a write operation. These techniques are relatively simple but they of course require an additional terminal besides those necessary for normal memory operation. While such an additional terminal may be available when the memory is tested in wafer form, significant test time also occurs after packaging, during which special test modes are also useful. In order to use this technique of a dedicated test enable terminal for package test, it is therefore necessary that the package have a pin or other external terminal for this function. Due to the desires of the system designer that the circuit package be as small as possible, with as few connections as possible, the use of a dedicated pin for test mode entry is therefore undesirable. Furthermore, if a dedicated terminal for entering the test mode is provided in packaged form, the user of the memory must take care to ensure that the proper voltage is presented to this dedicated terminal so that the test mode is not unintentionally entered during system usage.

Another technique for enabling special test modes is the use of an overvoltage signal at one or more terminals which have other purposes during normal operation, such overvoltage indicating that the test mode is to be enabled, such as is also described in U.S. Pat. No. 4,654,849, and in U.S. Pat. No. 4,860,259 (using an overvoltage on an address terminal). Said U.S. Pat. No. 4,860,259 also describes a method which enables a special test mode in a dynamic RAM responsive to an overvoltage condition at the column address strobe terminal, followed by the voltage on this terminal falling to a low logic level. The McAdams et al. article cited hereinabove, describes a method of entering test mode which includes the multiplexing of a test number onto address inputs while an overvoltage condition exists on a clock pin, where the number at the address inputs selects one of several special test modes. Such overvoltage enabling of special test modes, due to its additional complexity, adds additional security that special test modes will not be entered inadvertently, relative to the use of a dedicated control terminal for enabling the test modes.

However, the use of an overvoltage signal at a terminal, where that terminal also has a function during normal operation, still is subject to inadvertent enabling of the special mode. This can happen during "hot socket" insertion of the memory, where the memory device is installed into a location which is already powered up. Depending upon the way in which the device is physically placed in contact with the voltages, it is quite possible that the terminal at which an overvoltage enables test mode is biased to a particular voltage before the power supply terminals are so biased. The overvoltage detection circuit conventionally used for such terminals compares the voltage at the terminal versus a power supply or other reference voltage. In a hot socket insertion, though, the voltage at the terminal may be no higher than the actual power supply voltage, but may still enable the special mode if the terminal sees this voltage prior to seeing the power supply voltage that the terminal is compared against. Accordingly, even where special test modes are enabled by an overvoltage signal at a terminal, a hot socket condition may still inadvertently enable the special mode.

It should also be noted that similar types of inadvertent enabling of special test modes can occur during power up of the device, if the transients in the system are such that a voltage is presented to the terminal at which an overvoltage selects the test mode, prior to the time that the power supply voltage reaches the device. Furthermore, due to the random nature in which internal nodes of the device can power-up, many prior devices can power up in the special test mode even without the presentation of such signals.

The inadvertent test mode entry is especially dangerous where a similar type of operation is required to disable the test mode. For example, the memory described in the McAdams et al. article requires an overvoltage condition, together with a particular code, to return to normal operation from the test mode. In the system context, however, there may be no way in which an overvoltage can be applied to the device (other than the hot socket or power up condition that inadvertently placed the device in test mode). Accordingly, in such a system, if the memory device is in test mode, there may be no way short of powering down the memory in which normal operation of the memory may be regained.

It is therefore an object of this invention to provide an improved circuit and method for inhibiting the enabling of a special mode in an integrated circuit device during power-up of the device.

It is a further object of this invention to provide such an improved circuit and method which ignores, for purposes of test mode entry, signals received at certain terminals until power-up has been achieved.

It is a further object of this invention to provide such an improved circuit and method which precludes the powering-up of the device in special operating or test mode.

Other objects and advantages of the invention will become apparent to those of ordinary skill in the art having reference to this specification.

SUMMARY OF THE INVENTION

The invention may be incorporated into a memory device having special test or operating modes selectable by a code at certain terminals, and within which a power-on reset circuit is provided. The circuitry for enabling a special test mode is constructed in such a way that it powers up in a known condition, with the power-on reset circuit inhibits changes from this known condition which can be caused by signals intentionally applied to, or inadvertently appearing at, terminals of the device during the power-up sequence.

BRIEF DESCRIPTION OF THE DRAWINGS

FIG. 4 is an electrical diagram, in schematic form, of a first embodiment of a power-on reset circuit, including a reset circuit therewithin, as used in the test mode enable circuitry of FIG. 2.

FIGS. 4a and 4b are electrical diagrams, in schematic form, of alternate embodiments of reset circuits for the power-on reset circuit of FIG. 4.

FIG. 5 is an electrical diagram, in schematic form, of the evaluation logic in the test mode enable circuitry of FIG. 2.

DETAILED DESCRIPTION OF THE PREFERRED EMBODIMENT

Figure 1:
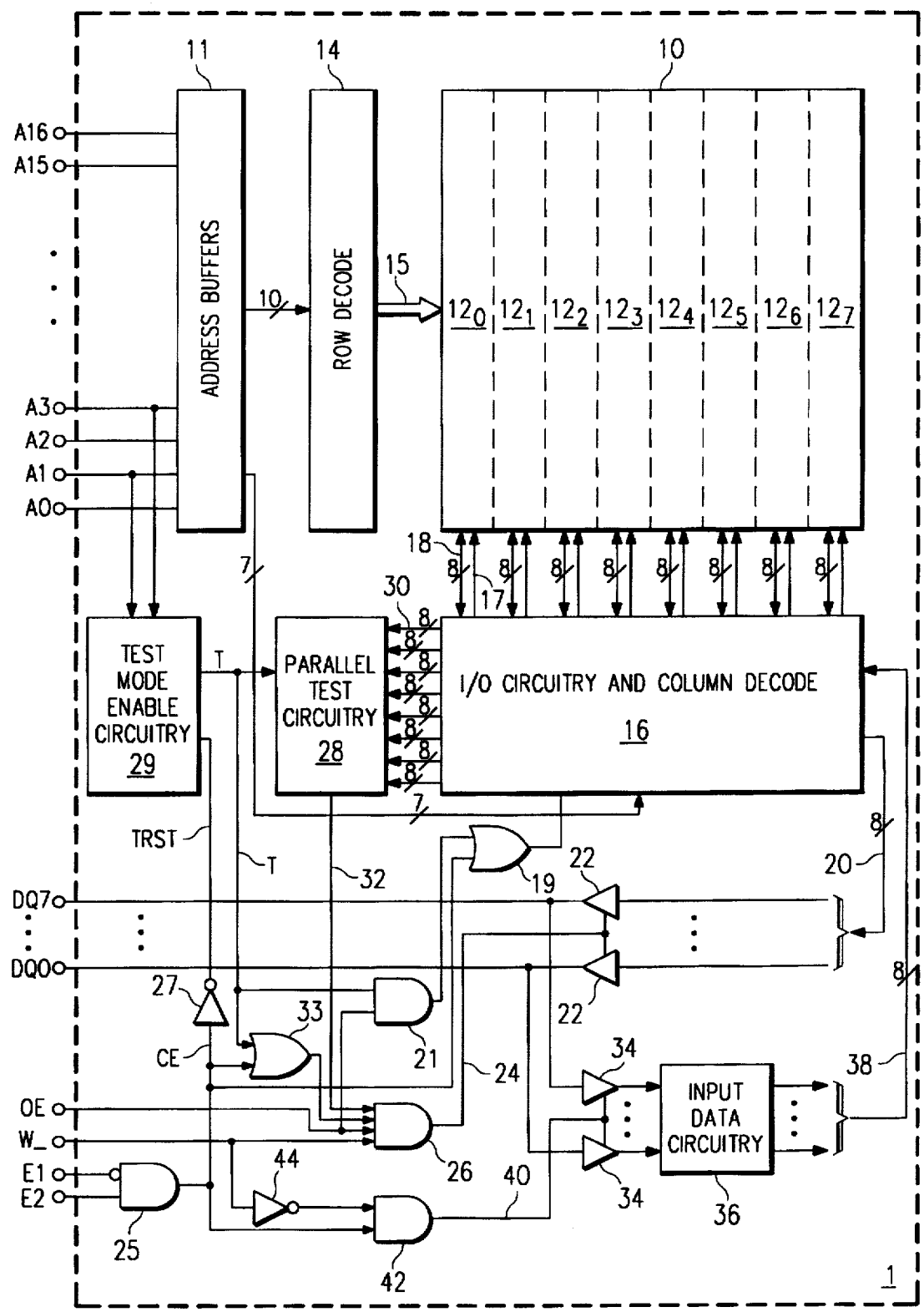
FIG. 1 is an electrical diagram, in block form, of a memory device incorporating the preferred embodiment of the invention.

Referring now to FIG. 1, a block diagram of an integrated circuit memory 1 incorporating the preferred embodiment of the invention described herein will be discussed. Memory 1 is an integrated circuit memory, for example a static random access memory (SRAM), having $2^{20}$, or 1,048,576, storage locations or bits. Memory 1 in this example is a wide-word memory, organized as $2^{17}$, or 128k, addressable locations of eight bits each. Accordingly, for example in a read operation, upon the access of one of the memory locations, eight data bits will appear at the eight input/output terminals DQ0 through DQ7. Memory 1, in this example, includes an array 10 which has 1024 rows of 1024 columns, with eight columns accessed in each normal memory operation.

In this example of memory 1, memory array 10 is divided into eight sub-arrays $12_0$ through $12_7$, each of which have 1024 rows and 128 columns. For purposes of reducing the power consumed during active operation, in this embodiment only one of the sub-arrays 12 is energized during each active cycle, with the selection of the sub-array 12 to be energized determined by the desired memory address (i.e., three bits of the column address). Accordingly, as will be further described hereinbelow, during a normal memory operation such as a read, all eight bits of the accessed memory location will be located in the same sub-array 12.

Memory 1 includes seventeen address terminals A0 through A16, for receiving the seventeen address bits required to specify a unique memory address. In the conventional manner, the signals from these seventeen address terminals are buffered by address buffers 11. After such buffering, signals corresponding to ten of the address terminals (A7 through A16) are received by row decoder 14, for selecting the one of the 1024 rows in array 10 to be energized by row decoder 14 via bus 15. Signals corresponding to the remaining seven address terminals (A0 through A6) are received by input/output circuitry and column decoder 16 to select one of sub-arrays 12 by way of control lines 17, and to select the desired columns therein according to the column address value. While single lines are indicated for the communication of the address value from address buffers 11 to row decoder 14 and input/output circuitry and column decoder 16, it should be noted that many conventional memories communicate both true and complement values of each address bit to the respective decoders, for ease of decoding.

As noted above, for purposes of reducing power consumption, memory 1 according to this embodiment energizes only one of sub-arrays 12, selected according to the three most significant column address bits. In this embodiment, repeaters (not shown) are present between sub-arrays 12 for controlling the application of the energized word line within the sub-array 12. In this way, the column address (particularly the three most significant bits) controls the application of the word line so that only that portion of the word line in the selected sub-array 12 is energized through the memory operation cycle. Column decoder 16 also selects eight of the 256 columns in the selected sub-array 12, according to the value of the remaining bits of the column address. In this embodiment, also for purposes of reducing active power consumption, only those sense amplifiers (not shown) in the selected sub-array 12 which are associated with the desired memory bits are energized. The sense amplifiers so selected by column decoder 16 are then in communication with input/output circuitry and column decoder 16 via local data lines 18, through which the reading of data from or writing of data to the eight selected memory cells in array 10 may be done in the conventional manner.

Of course, many alternative organizations of memory 1 may be used in conjunction with the invention described herein. Examples of such organizations would include by-one memories, where a single bit is input to or output from in normal operation. In addition, wide-word memories where each sub-array is associated with one of the input/output terminals, and memories where the entire array is energized during normal operation, may alternatively be used. As mentioned hereinabove, of course, other memory types such as dynamic RAMs, EPROMs, and embedded memories, each with organization of their own, may also benefit from this invention.

It should also be noted that the block diagrams of this embodiment of the invention, illustrating the electrical placement of the circuits, may not necessarily correspond to the physical layout and placement of the circuitry on an actual memory 1. It is contemplated that the physical layout and placement of sub-arrays 12 on the memory chip may not correspond to that shown in FIG. 1; for example, the eight sub-arrays 12 may be placed in such a manner that input/output circuitry and column decoder 16 is physically located between groups of sub-arrays 12, and similarly row decoder 14 may be physically located between groups of sub-arrays 12. It is contemplated that such layout optimization can be determined by one of ordinary skill in the art according to the particular parameters of interest for the specific memory design and manufacturing processes.

Circuitry for controlling the communication of data between input/output circuitry and column decoder 16 of memory 1 is also schematically illustrated in FIG. 1. It is of course contemplated that other control circuitry for controlling the operation of memory 1 as is conventional will also be incorporated into memory 1; such circuitry is not shown in FIG. 1 for purposes of clarity. Output data bus 20, which is eight bits wide in this example, is driven by input/output circuitry and column decoder 16, in a read operation, with the data states of the memory location accessed according to the memory address. Each line of output data bus 20 is received by non-inverting output buffer 22, which drives the output terminal DQ with the correct data state, at levels and currents corresponding to the specifications of memory 1. Each of output buffers 22 are enabled by a signal on line 24 from AND gate 26. The signal on line 24 thus controls whether the logic level on output data bus 20 is presented at terminals DQ, or if output buffers 22 present a high-impedance state to terminals DQ.

AND gate 26, in this embodiment, has four inputs. A first input of AND gate 26 receives a chip enable signal via AND gate 25 and OR gate 33. AND gate 25 receives signals from terminal E1 at an inverting input and from terminal E2 at a non-inverting input, such that the output of AND gate 25, on line CE, is at a high logic level responsive to terminal E1 being low and terminal E2 being high. The output of AND gate 25, on line CE, is connected to a first input of OR gate 33, which receives a signal on line T from test mode enable circuitry 29, as will be described hereinbelow. During normal operation, line T will be at a low logic level, so that OR gate 33 will respond directly to the state of line CE from AND gate 25. Accordingly, in this embodiment, the output of OR gate 33 corresponds to a chip enable signal, and enables the operation of memory 1 and the operation of output buffers 22. Of course, as is well known in the art, the chip enable signal may be generated from alternative logical combinations of multiple enable signals, or from a single chip enable terminal, as is conventional for some circuits in the art.

As shown in FIG. 1, in the example of memory 1 according to this embodiment of the invention, line CE is connected to one input of OR gate 19, the output of which is connected to input/output circuit and column decoder 16 for controlling the enabling and disabling thereof. Other functional blocks are also generally controlled by chip enable terminals E1 and E2 via OR gate 19, in a similar manner; the connections for performing such control are not shown in FIG. 1 for clarity. The other input of OR gate 19 receives the output of AND gate 21, which receives line T from test mode enable circuitry 29 at one input, and receives terminal OE at its other input. As will be described in further detail hereinbelow, this construction allows the output enable terminal OE to provide a chip enable function when memory 1 is in test mode.

A second input received by AND gate 26 is the write enable signal received at terminal W__. Accordingly, when AND gate 25 indicates selection of memory 1 in combination with write enable terminal W__ at a high logic level, indicating a read operation, AND gate 26 can enable output buffers 22. Conversely, during a write operation indicated by write enable terminal W__ at a low logic level, AND gate 26 will necessarily have a low logic level and will therefore necessarily place output buffers 22 in the high impedance state at their output. A third input received by AND gate 26 is an output enable signal from terminal OE, as is conventional in the art for enabling and disabling the output terminals; the use of an output enable signal is useful especially when multiple memories 1 have their output terminals connected together in wired-OR fashion.

The fourth input received by AND gate 26 in this embodiment is generated by parallel test circuitry 28, which performs a comparison of multiple data words when memory 1 is placed into a special test mode. Parallel test circuitry 28 receives, on lines 30, multiple eight bit data words from input/output circuitry and column decoder 16; each of these data words corresponds to the data read from one of sub-arrays 12 according to a portion of the column address. Parallel test circuitry 28 performs the comparison of these multiple data words, and generates a signal on line 32 corresponding to whether or not the comparison was successful.

When the special test mode for parallel test is enabled by a high logic level on line T connected thereto, parallel test circuitry 28 performs the comparison of the multiple data words presented thereto on lines 30, and generates a signal on line 32 corresponding to whether or not the comparison was successful. In this embodiment, line 32 is driven to a high logic level by parallel test circuitry 28 in test mode when the multiple data words all present the same data, and to a low logic level in test mode when there is an error, i.e., when the multiple data words compared do not present the same data. In order that output buffers 22 are operable during normal operation, parallel test circuitry 28 will present a high logic level during normal operation, i.e., when parallel test circuitry 28 is not enabled.

Also as will be described in further detail hereinbelow, during a special test mode, line T will be driven to a high logic level by test mode enable circuitry 29. This will cause the output of OR gate 33 to go to a high level, allowing enabling of output buffers 22 in the absence of the chip enable condition of terminal E1 low and terminal E2 high; as will be noted hereinbelow, in this embodiment of memory 1, the chip enable condition will cause disabling of the special test mode. Accordingly, with a special test mode enabled, output enable terminal OE will, in effect, provide the chip enable function for memory 1.

It should be apparent from FIG. 1 that memory 1 is a common input/output memory, and as such terminals DQ both present output data and receive input data. Terminals DQ are thus connected to input buffers 34, which during write operations present the input data to input data control circuitry 36, which will communicate the input data, via input data bus 38, to the selected memory cells via input/output control circuitry and column decoder 16. Input buffers 34 are controlled in a similar manner as output buffers 22 discussed hereinabove, with the enabling signal on line 40 generated by AND gate 42, which performs the logical AND of the chip enable signal from terminal CE and the write enable signal from terminal W__ (inverted by inverter 44). In parallel test mode, input data may be written to multiple memory locations in memory 10 by input/output circuitry and column decoder 16 in the conventional manner, by enabling multiple memory locations and simultaneously writing the same data thereto.

Test mode enable circuit 29 is provided in memory 1 for enabling one of several special test modes. By way of explanation, the special test mode corresponding to parallel read and write operations is shown by way of parallel test circuitry 28 in FIG. 1. Other special test modes, such as described in the McAdams et al. article cited hereinabove, may also be enabled by test mode enable circuit 29, responsive to the inputs connected thereto.

Test mode enable circuit 29 receives signals from address terminals A1 and A3, and receives a signal from AND gate 25, via inverter 27, on line TRST. As will be described in further detail hereinbelow, responsive to a sequence of overvoltage conditions at terminal A3 with terminal A1 in a particular logic state, and so long as AND gate 25 indicates that memory 1 is not enabled, test mode enable circuitry 29 will generate a high logic level on line T, indicating to parallel test circuitry 28 in this embodiment, and to such other circuits in memory 1 as may be enabled by particular test modes, that the special test mode of operation is to be entered.

Test Mode Enable Circuitry

Figure 2:
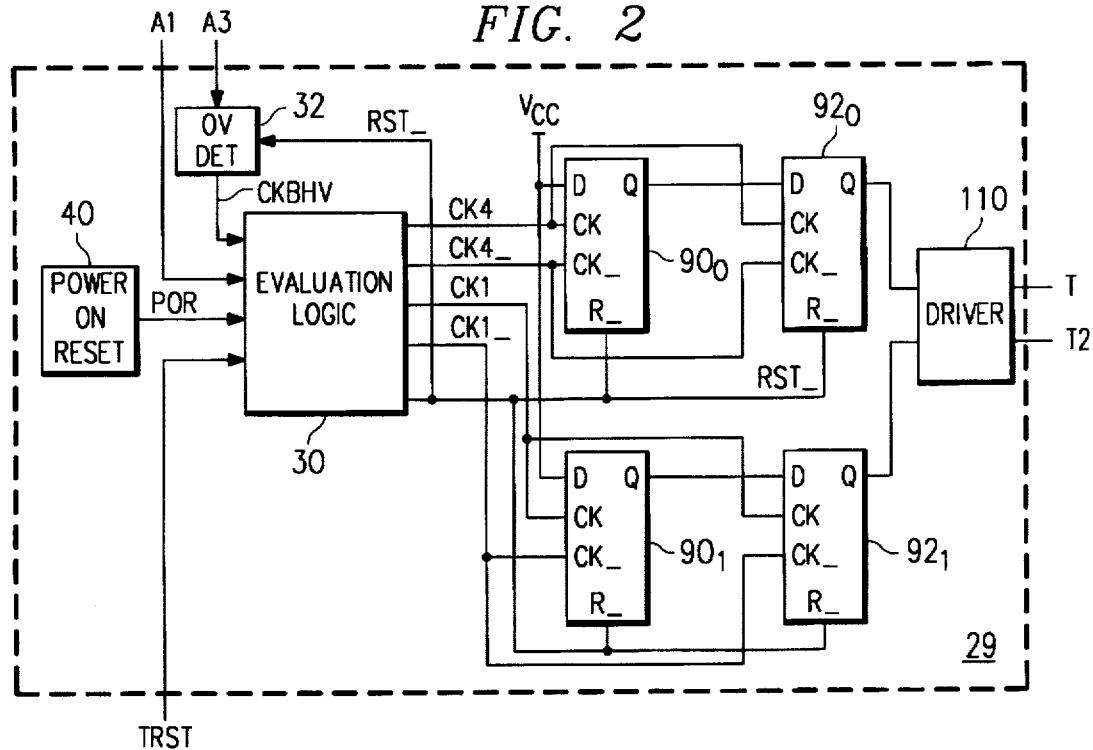
FIG. 2 is an electrical diagram, in block form, of the test mode enable circuitry of the memory of FIG. 1.

Referring now to FIG. 2, the construction of test mode enable circuitry 29 will now be described in detail. According to this embodiment of the invention, two distinct and mutually exclusive special test modes can be enabled, depending upon the logic state at terminal A3 at the time of the overvoltage condition at terminal A3. It should be noted that, while test mode enable circuitry 29 receives the logic state at terminal A3 prior to address buffers 11, alternatively the buffered value from terminal A3 could be communicated to test mode enable circuitry 29.

Test mode enable circuitry 29, as noted above, receives signals on lines A1, A3, and TRST as inputs. Test mode enable circuitry 29 presents signals on line T to parallel test circuitry 28, as noted above, to indicate whether or not the parallel test mode is enabled. Additionally, test mode enable circuitry 29 has another output on line T2, for enabling a second special test in memory 1, if desired. Line T2 is connected to such other circuitry in memory 1 as is necessary for performing such an additional test; such other special test, in this embodiment, is mutually exclusive with the parallel test function indicated by the signal on line T. While only two mutually exclusive special test modes are shown on FIG. 2, it is of course contemplated that many more special test functions may be enabled by simple extension of the logic included in test mode enable circuitry 29, including the use of additional ones of inputs such as address inputs for the selection of such additional special test modes. It is contemplated that such extension will be apparent to one of ordinary skill in the art having reference to this specification.. Furthermore, it should be noted that the special test modes enabled by test mode enable circuitry 29 need not be mutually exclusive of one another, as certain functions may work cooperatively with one another (e.g., a particular special read function may be enabled together with the parallel test mode, with the parallel test without the special read function separately selectable).

Test mode enable circuitry 29 includes evaluation logic 30, which receives a signal from address terminal A1 on the line marked A1 in FIG. 2. Evaluation logic 30 also receives, as an input, line TRST from the chip enable circuitry (i.e., AND gate 25 via inverter 27) so that, as will be described in further detail hereinbelow, the special test modes will be disabled, and normal operating modes entered, upon the selection of memory 1 by the chip enable inputs E1 and E2. Also according to this embodiment of the invention, evaluation logic 30 receives an input on line CKBHV, which is generated by overvoltage detector 32. Overvoltage detector 32 receives line A3 from the corresponding address terminal, for determining whether the voltage applied there at is in an overvoltage condition.

Further included in test mode enable circuitry 29 is power-on reset circuit 40, which provides an enable signal on line POR to evaluation logic 30 (as well as to other circuitry in memory 1) at a point in time after power supply $V_{cc}$ is powered up. As will be described in further detail hereinbelow, power-on reset circuit 40, via evaluation logic 30, will lock out entry into test mode during power-up of memory 1.

Test mode enable circuitry 29 also includes D-type flip-flops 90 and 92 connected in series with one another, and having their clock and reset inputs controlled by evaluation logic. As mentioned above, two special test modes are selectable in this embodiment of the invention; test mode enable circuitry 29 thus includes two pair of flip-flops 90 and 92, each pair for enabling the selection of a particular special test mode via drivers 110. As will be described in more detail below, the provision of a series of multiple flip-flops 90, 92 for each of the special test modes in test mode enable circuitry 29 is so that a sequence of signals (e.g., a series of overvoltage excursions on address terminal A3) must be presented in order for a special test mode to be enabled, rather than only requiring a single such signal or overvoltage excursion. The requirement of a sequence of two or more such signals for enabling a special test mode provides a high degree of security that such a mode will not be inadvertently entered, due to noise, power loss and restoration, hot socket insertion, or other such events.

Overvoltage Detection

Figure 3:
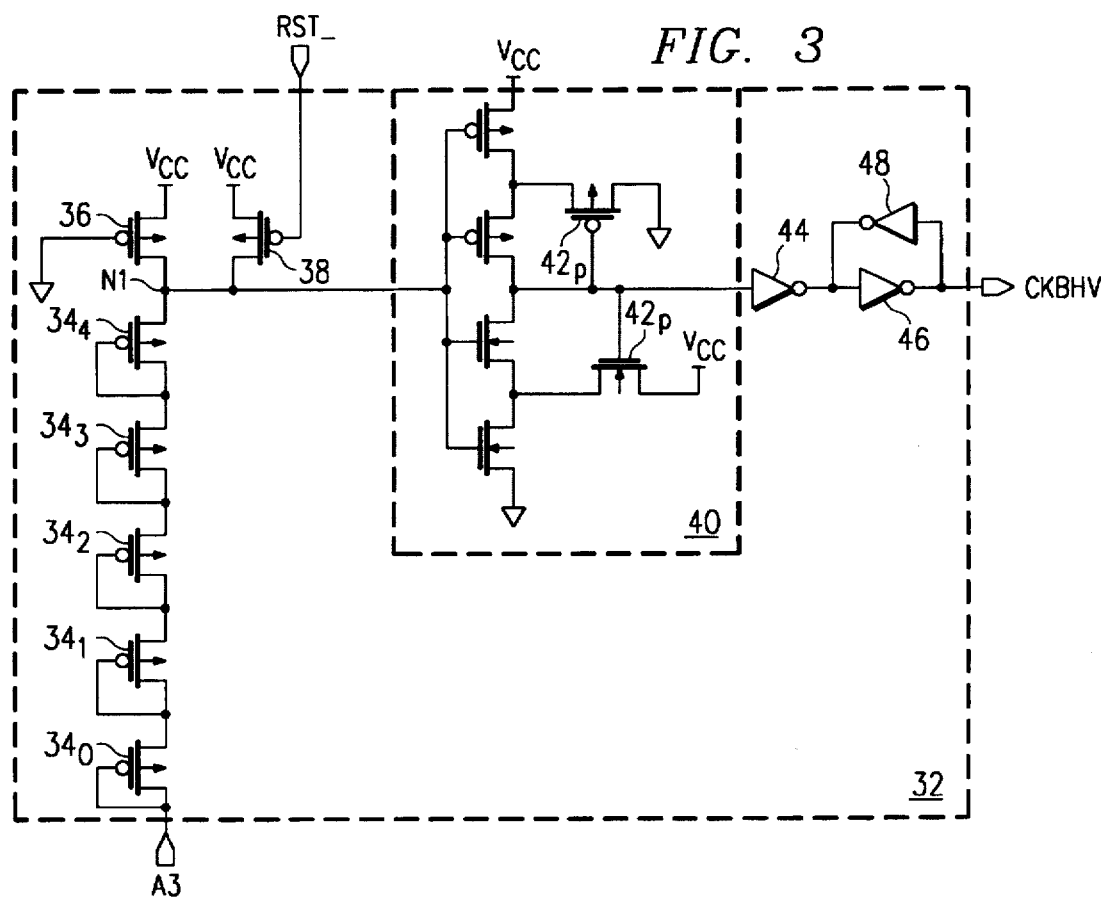
FIG. 3 is an electrical diagram, in schematic form, of the overvoltage detector circuit in the test mode enable circuitry of FIG. 2.

Referring now to FIG. 3, the construction and operation of overvoltage detector 32 will now by described in detail. As will be apparent from this description, the overvoltage condition detected by overvoltage detector 32, responsive to which line CKBHV will go to a high logic level to indicate the overvoltage condition, is the condition where the voltage applied to terminal A3 is a certain value below ground, or $V_{ss}$. It should be noted that a positive overvoltage condition (i.e., the voltage at terminal A3 exceeding a certain value greater than the positive power supply to memory 1, or $V_{cc}$) can alternatively be detected by overvoltage detector 32, with the appropriate design modifications made thereto.

Line A3 from the corresponding address terminal is connected to the drain of p-channel transistor $34_0$. According to this embodiment, p-channel transistors $34_0$ through $34_4$ are p-channel transistors connected in diode configuration (i.e., with their gates connected to their drains), and connected in series with one another to establish a diode chain. While five transistors 34 are used in this embodiment of overvoltage detector 32, it should be noted that the number of transistors 34 so used depends upon the trip voltage at which overvoltage detector 32 is to issue the overvoltage signal. The number of transistors 34 used, and their threshold voltages, will of course determine this value.

At node N1, the source of transistor $34_4$, the top one of transistors 34 in the diode chain, is connected to the drain of a p-channel pull-up transistor 36. Transistor 36 has its source connected to $V_{cc}$, and its gate connected to $V_{ss}$. Transistor 36 is a relatively small transistor relative to transistors 34, in terms of its width-to-length ratio (W/L). For example, the W/L of transistor 36 in this embodiment is on the order of 1/250, while the W/L of transistors 34 is on the order of 2. Accordingly, when transistors 36 are in a conductive state, they will be capable of pulling down node N1 even though transistor 36 remains conductive.

In this embodiment, also connected to node N1 is the drain of p-channel transistor 38, which has its source connected to $V_{cc}$ and its gate controlled by a signal on line RST_ from evaluation logic 30 (see FIG. 2). Transistor 38 is a relatively large transistor, relative to transistors 34 and 36, having a W/L on the order of 8, so that when it is conductive, node N1 can be pulled to $V_{cc}$ through it, even with transistors 34 in a conductive state. Transistor 38 is thus capable of resetting the state of overvoltage detector 32 responsive to a low logic level on line RST_, even with the voltage on line A3 in the overvoltage condition).

Mode N1 is connected to the input of a conventional inverting Schmitt trigger circuit 40. As is conventional for such circuits, Schmitt trigger 40 performs the logical inversion with hysteresis in its transfer characteristic. Such hysteresis, provided by n-channel transistor $42_n$ and p-channel transistor $42_p$, provides stability to overvoltage detector 32, so that small variations in the voltage of line A3 around the trip voltage will not cause the output of overvoltage detector 32 to oscillate between high and low logic levels.

The output of Schmitt trigger 40 is connected, via inverting buffer 44, to the input of a latch consisting of cross-coupled inverters 46 and 48. The input of inverter 46 receives the output of inverter 44, and the output of inverter 46 drives line CKBHV, which-is the output of overvoltage detector 32. Inverter 48 has its input connected to the output of inverter 46, and has its output connected to the input of inverter 46. In this embodiment, inverters 46 and 48 are both conventional CMOS inverters, with the W/L of the transistors in inverter 48 preferably much smaller (e.g., W/L on the order of 0.5) than those of inverter 46 (W/L on the order of 2.0). Such construction allows the state of line CKBHV to remain latched, but also allows inverter 44 (its transistors having W/Ls on the order of 1.0) to overwrite the state of the latch with relative ease. The presence of the latch of inverters 46 and 48 also lends additional stability to overvoltage detector 32, so that oscillations at the output on line CKBHV are less likely to be generated from small variations of the voltage of line A3 about the trip voltage.

In operation, the normal condition of overvoltage detector 32 (i.e., the voltage at terminal A3 in its nominal range) has node N1 pulled up, by transistor 36, to $V_{cc}$. This causes Schmitt trigger 40 to have a low logic level at its output which, by operation of inverters 44 and 46, presents a low logic level on line CKBHV. Inverter 48, together with inverter 46, latches this low logic level on line CKBHV. This condition indicates to the remainder of memory 1, via test mode enable circuitry 29 as will be described later, that the normal operational mode is selected.

Enabling of a special test mode is performed by presenting a voltage at terminal A3 which is sufficiently below the voltage of $V_{cc}$ to cause node N1 to be pulled low. The trip voltage level to which terminal A3 must be pulled is calculated by determining the voltage at which the diodes of transistors 34 will all be forward biased. With node N1 pulled to $V_{cc}$ by transistor 36, transistors 34 (in this case numbering five) will all be conductive when the voltage at terminal A3 is at or below voltage $V_{trip}$:

$$V_{trip} = V_{cc} - 5(V_{tp})$$

where $V_{tp}$ is the threshold voltage of p-channel transistors 34. For example, with a $V_{tp}$ on the order of 2.4 volts, $V_{trip}$ will have a value on the order of -7.0 volts, for a nominal $V_{cc}$ value of 5.0 volts.

With the voltage at terminal A3 at or below $V_{trip}$, node N1 is pulled low, toward the voltage of terminal A3. This causes Schmitt trigger 40 to present a high logic level at its output, which is in turn inverted by inverter 44. As noted above, inverter 44 is sufficiently large, relative to inverter 48, to cause inverter 46 to change state, presenting a high logic level on line CKBHV, indicating to the remainder of test mode enable circuitry 29 that terminal A3 is in the overvoltage condition.

Overvoltage detector 32 is reset to the normal operating condition in one of two ways. First, upon the return of terminal A3 to a voltage above $V_{trip}$, transistors 34 will become non-conductive, allowing transistor 36 to pull node N1 up toward $V_{cc}$. Upon node N1 reaching a voltage at which Schmitt trigger 40 switches, a low logic level will again be presented on line CKBHV. As will be noted hereinbelow, the operation of memory 1 according to the preferred embodiments of the invention requires that the overvoltage condition be presented at least twice in succession in order for the special test modes to be entered; accordingly, this is the usual way in which overvoltage detector 32 will be reset.

A second way in which overvoltage detector 32 is reset is by operation of transistor 38, responsive to a low logic level on line RST_. As will be discussed hereinbelow, line RST_ will be driven to a low logic level responsive to the unconditional exit from test mode into normal operating mode, triggered by various events. As noted above, transistor 38 is preferably large enough that it can pull node N1 high even with transistors 34 conducting, and accordingly cause Schmitt trigger 40 and inverters 44, 46, and 48 to make the transition required to present a low logic level on line CKBHV again. As noted in FIG. 2, line CKBHV is received by evaluation logic 30.

Power-on Reset

According to this embodiment of the invention, evaluation logic 30 also receives, at an input thereof, a signal on line POR from power-on reset circuit 40. The function of power-on reset circuit 40 is to prevent inadvertent entry into a special test mode upon power-up of memory 1. Accordingly, during such time as memory 1 is powering up, power-up reset circuit 40 will indicate the same to evaluation logic 30 via line POR and disable any entry into a special test mode. Once memory 1 is sufficiently powered up, power-up reset circuit 40 will indicate the same to evaluation logic 30 via line POR, and allow the overvoltage condition at terminal A3, and such additional or alternative indications of a desired entry into a special test mode, to enable a test mode.

Referring now to FIG. 4, the preferred construction and operation of power-on reset circuit 40 according to this embodiment of the invention will now be described. Power-on reset circuit 40 receives the power supply voltage $V_{cc}$ and the ground reference voltage $V_{ss}$. $V_{cc}$ and $V_{ss}$ bias the transistors in CMOS latch 42. Latch 42 is a conventional latch constructed of cross-coupled CMOS inverters, and also includes capacitor 44 connected between $V_{cc}$ and cross-coupled node C1 therein, and capacitor 46 which is connected between $V_{ss}$ and the other cross-coupled node C2 therein. As will be described in further detail hereinbelow, capacitors 44 and 46 preset latch 42 upon power-up of memory 1.

Latch 42 communicates its logic state to line POR, via a string of inverters 72 connected to cross-coupled node C2. The number of inverters 72 in this string (in this embodiment six), determines the delay time between the switching of latch 42 and the transition of line POR. Within the string of inverters 72, one plate of capacitor 50 is connected to the input of an inverter 72 which is an odd number of inverters from node C2 (in this case, at the input of the fifth inverter 72 from node C2), with the other plate connected to $V_{cc}$. Also within the string of inverters 72, capacitor 74 is connected on one side to the input of one of inverters 72, preferably an inverter 72 which is an odd number of inverters from node C2 (in this case, capacitor 74 is connected to the input of the third inverter 72 from node C2) and has its other plate connected to $V_{cc}$. Capacitor 74 serves to stabilize the operation of power-on reset circuit 40 so that it does not rapidly oscillate in the event of $V_{cc}$ making small excursions about the trip point of the circuit; capacitor 74 also slows the operation of the chain of inverters 72, as will be discussed in more detail hereinbelow.

Power-on reset circuit 40 further includes timed switch 48 biased between $V_{cc}$ and $V_{ss}$. $V_{cc}$ is connected to the source of a p-channel transistor 52 which has its gate connected to the plate of capacitor 50 which is connected within the chain of inverters 72. The drain of transistor 52 is connected to the drain of an n-channel transistor 54, which has its gate tied to $V_{cc}$ and its source biased by $V_{ss}$. Transistor 52 is preferably larger than transistor 54, with the W/L on the order of 10 and 4, respectively. The drains of transistors 52 and 54 are connected to one plate of a capacitor 56, which has its opposing plate tied to $V_{ss}$, and to the gate of transistor 58, which has its drain connected to cross-coupled node C1 of latch 42, and which has its source at $V_{ss}$. As will be apparent in the description of the operation hereinbelow, timed switch 48 causes latch 42 to change its state at a period of time after the powering up of $V_{cc}$.

It should be noted that the provision of latch 42, timed switch 48, and the delay chain of inverters 72, are conventional in power-on reset circuits. Such conventional power-on circuits, not including a reset circuit such as reset circuit 60 shown in FIG. 4, are subject to inaccurate operation in the event of brief power losses if the state of the power-on circuit is not quickly reset in the event of a power loss. If the power supply is lost and then restored before the power-on reset circuit has had time to return to its proper initial state, the power-on reset circuit will be immediately issuing the signal to the remainder of the circuit (i.e., the same signal as it was issuing at the time of power loss) that power-on has fully occurred, and enable normal operation of the circuit, before full power-up occurs. This allows the remainder of the circuit to initialize in a random, and therefore potentially undesirable, state. An example of such an undesired state is a special test mode.

According to this embodiment of the invention, however, power-on reset circuit 40 further includes reset circuit 60, which ensures that the state of power-on reset circuit 40 is fully and quickly reset upon power supply $V_{cc}$ falling below a certain level. Reset circuit 60 includes n-channel transistor 62, which has its source-to-drain path connected between cross-coupled node C2 of latch 42 and $V_{cc}$, and has its gate coupled to one plate of capacitor 66, which has its other plate connected to $V_{ss}$. The gate of transistor 62 is further connected to the sources of transistors 68 and 70. N-channel transistors 68 and 70 each have their drains connected to $V_{cc}$; the gate of transistor 68 is connected to the gate of transistor 62, and the gate of transistor 70 is connected to $V_{cc}$. As will be discussed hereinbelow relative to the operation of reset circuit 60, it is preferable that transistor 62 be constructed so that it has a threshold voltage which is lower than that of transistor 68. As is well known in the art, this can be done by way of different threshold adjust ion implantation for transistors 62 and 68, or alternatively by making the W/L ratio of transistor 62 significantly greater than that of transistor 68.

The operation of power-on reset circuit 40, including reset circuit 60, will now be described beginning from a state in which no power is applied to $V_{cc}$, and as memory 1 is powered up. As ramps up from an unpowered condition, capacitors 44 and 46 will cause latch 48 to set in a state where node C1 is at a high level and node C2 is at a low level, due to the action of capacitors 44 and 46 respectively connected thereto. A low logic level at cross-coupled node C2 will present, via the six inverters 72, a low logic level at line POR. This indicates to the remainder of memory 1, and specifically to evaluation logic 30, that memory 1 is not yet sufficiently powered up. As will be described further hereinbelow, this will prevent entry of memory 1 into a special test mode. In this initial state, transistor 62 in reset circuit 60 remains off, as its gate (at capacitor 66) has not yet charged up through transistor 70.

As power-up begins, the gate of transistor 52 in timed switch 48, connected to the plate of capacitor 50 which is also connected to the input of an odd inverter 72 following node C2, is at a low logic level since node C2 is low. Transistor 52 is thus turned on as $V_{cc}$ rises above a certain level during power up; while transistor 54 is also turned on, due to transistor 52 being much larger than transistor 54 the node at the drains of transistors 52 and 54 is pulled toward $V_{cc}$. After power supply $V_{cc}$ reaches a certain level as it powers up, for example 3.3 volts, and since the gate of transistor 58 follows the drain of transistor 52, transistor 58 also turns on, pulling node C1 low toward $V_{ss}$. This will pull cross-coupled node C1 to a low logic level, and switches latch 42 so that a high logic level is presented at node C2. After the time necessary to ripple through chain of inverters 72, including charging up capacitor 50 at the input of the fifth inverter 72 in the chain, line POR goes to a high logic level, and indicates to the remainder of memory 1, including evaluation logic 30, that power-up has occurred. An example of a preferred delay time between the point in time at which $V_{cc}$ reaches the trip level and the issuing of a high logic level on line POR is on the order of ten nanoseconds.

Once the high logic level at node C2 has rippled through the chain of inverters 72, capacitor 50 is charged in such a state that the gate of transistor 52 is at a high voltage, which turns off p-channel transistor 52. At this time, due to the operation of transistor 54 with its gate at $V_{cc}$, the gate of transistor 58 is pulled low, turning off transistor 58. This allows node C1 to be held at a low logic level by the operation of latch 42, but with no external driving voltage applied thereto. As a result, reset circuit 60 can easily reset latch 42 to its prior state, in the event of a loss of voltage at power supply $V_{cc}$.

Also after power-up, due to the operation of n-channel transistor 70, the gate of transistor 62 is at a voltage approximately $V_{cc}-V_{t70}$ ($V_{t70}$ being the threshold voltage of transistor 70), which turns transistor 62 on. This connects node C2 to $V_{cc}$ through transistor 62, which further assists the holding of node C2 high and, by operation of latch 42, assists the holding of node C1 low. Accordingly, latch 42 remains in this state for so long as $V_{cc}$ remains powered up, with the powered up state indicated by a high logic level on line POR.

In the event that the voltage of power supply $V_{cc}$ falls to a certain level below its nominal operating level, however, power-on reset circuit 40 will be reset by reset circuit 60. As $V_{cc}$ falls toward zero volts, the gate of transistor 62 will follow $V_{cc}$ while remaining at approximately $V_{t68}$ above the voltage of $V_{cc}$. This voltage remains at the gate of transistor 62 upon power supply $V_{cc}$ reaching zero volts, due to capacitor 66 being previously charged to $V_{cc}-V_{t70}$, and due to transistor 68 acting as a forward-biased diode. Since the threshold voltage of transistor 62 is lower than that of transistor 68, as described above, transistor 62 is on as power supply $V_{cc}$ reaches zero volts. This discharges cross-coupled node C2 of latch 42 to $V_{cc}$, which is at a low logic level (zero volts).

It should be noted that the use of an n-channel transistor 70, rather than a p-channel transistor, will be important for most CMOS implementations of the circuit of FIG. 4. As is conventional in CMOS, the n-well regions into which p-channel transistors are formed are generally biased to $V_{cc}$, to ensure that the source-to-well junctions of the p-channel transistors are not forward biased. If such a p-channel transistor were used in place of transistor 70 (of course with its gate connected to the gate of transistor 62 to implement the same function), the gate of transistor 62 would be clamped to the forward biased p-n junction voltage drop (on the order of 0.7 volts), rather than to $V_{t68}$, upon power supply $V_{cc}$ falling to ground. If the threshold voltage of transistor 62 is higher than this drop, transistor 62 would not be conductive, and reset circuit 60 would not be operable to quickly discharge node C2 in latch 42. It is therefore preferable to use n-channel transistor 70, which will present a reverse-biased diode to the gate of transistor 62 as $V_{cc}$ falls, allowing the gate of transistor 62 to fall to the voltage of $V_{t68}$.

This discharging of node C2 to ground as $V_{cc}$ falls ensures that power-on reset circuit 40 will properly operate even if the loss of voltage on $V_{cc}$ is short. Proper operation of power-on reset circuit 40 is the generation of a low logic level on line POR for a certain length of time upon power-up, i.e., until $V_{cc}$ has been above a certain level for a certain time at which time line POR returns high. Such operation requires that, for the circuit of FIG. 4, latch 42 must, on power-up, set to a state with node C1 high and node C2 low, with timed switch 48 causing the switching of latch 42 and the generation of the high logic signal on line POR thereafter. In the event of a brief loss of power, after which the proper power-on reset procedure (including the locking out of special test modes) is desired, reset circuit 60 ensures the resetting of latch 42 by discharging node C2 (and capacitor 46) through transistor 62. Without this discharge path provided by reset circuit 60, capacitor 46 may not be sufficiently discharged by way of leakage so that it would set node C2 low again upon power-up after a brief loss of voltage at power supply $V_{cc}$.

It should further be noted that capacitor 66 also slows the rate at which transistor 62 turns on as power-up begins. This ensures that it is the operation of timed switch 48 which causes latch 42 to change state on power-up, rather than the premature charging of node C2 through transistor 62. Accordingly, by way of capacitor 66, reset circuit 60 does not disturb the operation of power-on reset circuit 40 during the power-up sequence.

Referring now to FIGS. 4a and 4b, the construction and operation of alternative reset circuits 60a and 60b which may be included in power-on reset circuit 40 in place of reset circuit 60 will now be described in detail. FIG. 4a shows a first alternative reset circuit 60a which includes transistor 62, having its source-to-drain path connected between cross-coupled node C2 of latch 42 and $V_{cc}$, and having its gate connected to the source of transistor 68, as in reset circuit 60 of FIG. 4. Unlike reset circuit 60 of FIG. 4, reset circuit 60a does not include capacitor 66 connected between the gate of transistor 62 and $V_{sr}$. Transistor 68, as in the case of FIG. 4, is configured in diode fashion, with its source-to-drain path connected between $V_{cc}$ and the gate of transistor 62, and with its gate connected to the gate of transistor 62. N-channel transistors 70 and 71 are configured in diode fashion and connected in series between $V_{cc}$ and the gate of transistor 62, oriented in a direction so that they are forward biased with $V_{cc}$ positive relative to the gate of transistor 62.

Reset circuit 60a of FIG. 4a, due to series transistors 70 and 71 between $V_{cc}$ and the gate of transistor 62, delays and clamps the charging of the gate of transistor 62 during the powering up of power supply $V_{cc}$, so that transistor 62 does not turn on until after latch 42 (shown in FIG. 4) has switched. Additional transistors may be included in series with transistors 70 and 71, to further delay the turning on of transistor 62 as desired. However, in order for transistor 62 to be capable of discharging node C2 as power supply $V_{cc}$ falls, the number of transistors in series between $V_{cc}$ and the gate of transistor 62 cannot be so large that the voltage at the gate of transistor 62 is clamped at a voltage lower than its threshold voltage. If this is the case, transistor 62 will not turn on during power-up, nor will it be on during power-down, precluding the operation of reset circuit 60. It should be noted that a capacitor may be connected to the gate of transistor 62, in similar manner as capacitor 66 in FIG. 4, in combination with multiple transistors 70, 71 in the series connection of FIG. 4a, to further assist the delay in the charging of the gate of transistor 62 during power-up without affecting its clamped voltage.

Referring now to FIG. 4b, a reset circuit 60b according to another embodiment of the invention is illustrated, for use in power-on reset circuit 40 of FIG. 4, in substitution for reset circuit 60. Reset circuit 60b is constructed similarly as reset circuit 60 of FIG. 4, with the source-to-drain path of transistor 62 connected between cross-coupled node C2 of latch 42 and $V_{cc}$. The gate of transistor 62 is connected to n-channel transistor 70, and is also connected to a plate of capacitor 66. Transistor 70, as in FIG. 4, is connected in diode configuration between $V_{cc}$ and the gate of transistor 62, with its gate connected to $V_{cc}$. Reset circuit 60b also includes n-channel transistors 68 and 73, which have their source-to-drain paths connected in series between $V_{cc}$ and the gate of transistor 62, and which each have their gates connected to the gate of transistor 62. It should be noted that transistors 68 and 73 may be fabricated in such a way that their threshold voltages are the same as that of transistor 62.

As discussed above relative to FIG. 4, for reset circuits 60 (and 60a and 60b) to properly operate, transistor 62 must be on at such time as power supply $V_{cc}$ is powered down, even to zero volts. In reset circuit 60, this is accomplished by fabricating transistors 62 and 68 in such a manner that their threshold voltages differ, with the threshold voltage of transistor 62 below that of transistor 68. However, such a fabrication requirement may not be compatible with the fabrication process used to make memory 1. In addition, many variables in the fabrication process of integrated circuits are known to have significant effects on threshold voltages. The alternative reset circuit 60b presents a circuit which has potentially reduced process sensitivity than reset circuit 60, due to the use of series transistors 68 and 73.

In power-up, reset circuit 60b operates similarly to reset circuit 60 of FIG. 4. When power supply $V_{cc}$ is powered down, however, the voltage to which the gate of transistor 62 will fall will be held by transistors 68 and 73 is $V_{cc}+V_{t68}+V_{ds73}$, where $V_{ds73}$ is the series voltage drop of the source-to-drain path of transistor 73. Accordingly, once transistor 70 is reverse-biased in power-down, with the threshold voltage of transistors 62 and 68 equal (i.e., $V_{t62}=V_{t68}$), the voltage at the gate of transistor 62 will be higher than $V_{cc}$ (i.e., the source of transistor 62) by more than its threshold voltage. Transistor 62 will thus serve to discharge node C2 to the powered-down $V_{cc}$, resetting latch 42.

The connection of the gate of transistor 73 to the gate of transistor 72, rather than in diode configuration, is preferable in reset circuit 60b for purposes of controlling the voltage at the gate of transistor 62 when power supply $V_{cc}$ is powered up. The voltage $V_{ds73}$ is smaller in magnitude than the threshold voltage of transistor 73, and accordingly the voltage at the gate of transistor 62 is not higher than necessary to discharge cross-coupled node C2. This is beneficial because the voltage of power supply $V_{cc}$, as it powers up, will capacitively couple to the gate of transistor 62 via transistors 68, 70 and 73, and be additive with whatever voltage is present at the gate of transistor 62 at that time. As noted above, it is desirable that transistor 62 not be turned on prior to the operation of timed switch 48, as this would cause latch 42 to switch prior to full power-up of $V_{cc}$. The likelihood of such premature conduction through transistor 62 increases with higher voltages at its gate at the time of power-up of power supply $V_{cc}$. Reset circuit 60b thus keeps the voltage at the gate of transistor 62 high enough for conduction during power-down, but not excessively high, reducing the likelihood of this undesired conduction.

In the alternative reset circuit 60b, the reduced process sensitivity is obtained from the reduced dependence of the operation of the circuit on a differential threshold voltage. Indeed, transistors 62 and 68 can be fabricated to be of the identical size, and substantially at the same location in the integrated circuit, so that variations in process will tend to affect transistors 62 and 68 identically. Due to the inclusion of series transistor 73, transistor 62 will still remain on in the power-down condition sufficiently long for the latch to be reset.

Of course, relative to reset circuit 60 of FIG. 4, the alternative embodiment of reset circuits 60a and 60b of FIGS. 4a and 4b require one or more additional transistors. It is contemplated that one of ordinary skill in the art will now be able to select from one of these alternatives, or from other alternatives which will now be apparent, according to the fabrication process variations, circuit requirements, and other such factors of the particular circuit under design.

It should also be noted that reset circuits 60, 60a and 60b, while described in conjunction with the resetting of a power-on reset circuit 40 for which their operation is particularly useful and beneficial, may also be used in other circuits in memory 1, and in other integrated circuits, whether or not including a memory function. For example, there may be particular nodes in such circuits which are preferably discharged quickly upon power-down of a power supply, without relying on a power-up reset circuit. It is contemplated that reset circuits 60, 60a, and 60b could be utilized to discharge such nodes, by connection to such nodes in lieu of cross-coupled node C2 which is discharged in the above description.

Evaluation Logic

Referring now to FIG. 5, the construction and operation of evaluation logic 30 will be described in detail. As noted above, lines POR and TRST are inputs to evaluation logic 30; in this embodiment, lines POR and TRST are connected to two inputs of NAND gate 76 which drives, via inverter 78, line RST__. Line POR is at a high level after memory 1 has been safely powered up for a period of time, as described hereinabove relative to FIG. 4, and is at a low logic level during such time as power supply $V_{cc}$ is lost or has just recently powered up. As described above relative to FIG. 1, line TRST is at a high logic level if memory 1 is not selected via chip enable inputs E1 and E2; when memory 1 is selected, line TRST is at a low logic level. Accordingly, upon either of lines POR or TRST being at a low logic level, line RST__ will be at a low logic level to cause test mode enable circuitry 29 to be reset and to prevent entry into test mode, as will be described hereinbelow. Only with memory 1 fully powered up, and not selected via chip select inputs E1 and E2, will line RST__ be at a high logic level, allowing entry into a special operating mode such as a special test mode.

Also as discussed above, evaluation logic 30 receives inputs on lines A1 and CKBHV. Line A1, from address terminal A1, selects the desired one of the two available test modes, in this embodiment. A high logic level on line CKBHV, indicating receipt of the overvoltage condition on the selected address input A3, will effectively clock in the state at address terminal A1 to select the desired test. This is accomplished in evaluation logic 30 by NAND gates $80_1$ and $80_0$ each having an input connected to line CKBHV, and having their other inputs coupled to line A1 inverted by inverter 82, and not inverted, respectively. Each of NAND gates 80 provide complementary outputs, via inverters 81. NAND gate $80_0$ thus drives signals on lines CK4 and CK4__, and NAND gate $80_1$ drives signals on lines CK1 and CK1__.

Figure 5A:
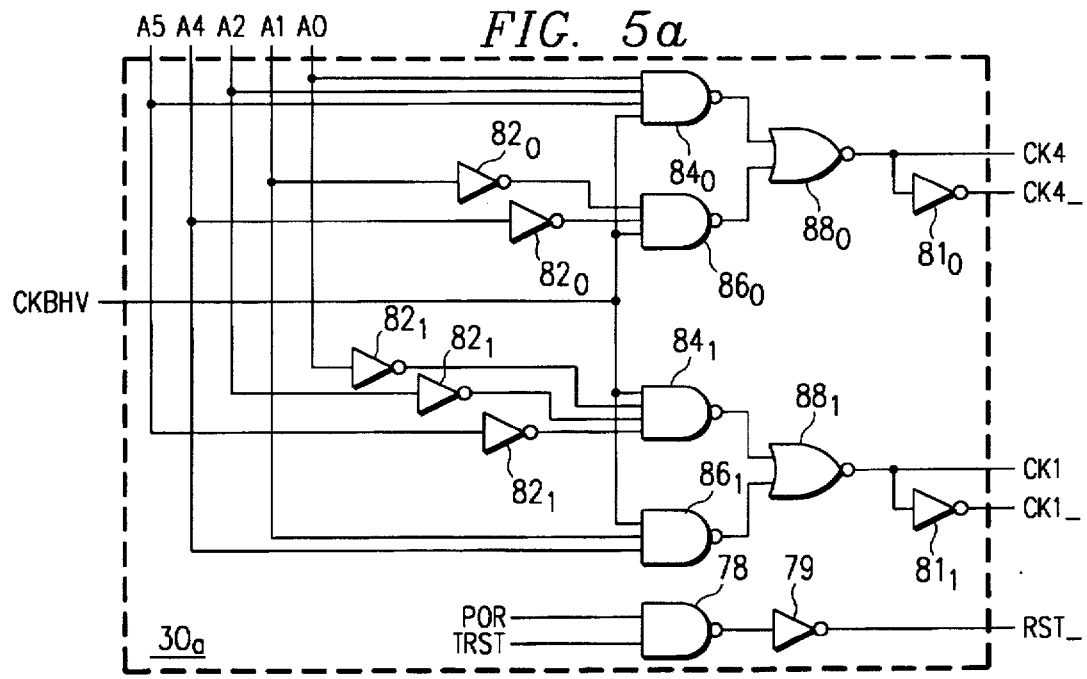
FIGS. 5a, 5b and 5c are electrical diagrams, in schematic form, of alternative embodiments of the evaluation logic in the test mode enable circuitry of FIG. 2.

Referring to FIG. 5a, evaluation logic 30a, which is an alternative embodiment of evaluation logic 30, will now be described. As discussed herein, security against the inadvertent entry into test mode is desirable, so that events such as noise, power-down and power-up sequences, and hot socket insertion do not cause entry into a special operating or test mode. Evaluation logic 30a provides further security against such inadvertent entry into test mode, by requiring provision of an expanded code for selecting a special test mode.

Prior techniques, such as described in the McAdams et al. article cited hereinabove, have utilized address terminals for the selection of one of several special test modes. In such prior techniques, however, the number of terminals used for the selection of a special test mode have been minimized, with only those terminals interrogated which are required to uniquely select all of the modes available. For example, in the McAdams et al. article, the minimum number of four terminals are used for selection from ten modes. Accordingly, in such situations as noise, power-up and the like described hereinabove, in the event that an overvoltage or other selection condition is present, the likelihood of entry into a special test mode is quite high.

Furthermore, in such prior techniques as the McAdams et al. article describes, a special test mode is selectable by a code where all of the terminals are at the same logic level, e.g., all "0"s. Such a condition is quite likely during a power-up or hot socket insertion, and accordingly the selection of a special test mode can occur if the overvoltage or other selection condition is present, and where the terminals used to select which of the several modes are at the same logic level.

Evaluation logic 30a provides additional security against the inadvertent entry into such test modes, by using more than the minimum number of address terminals required for the number of test (or other) modes selectable in memory 1; i.e. the available selection codes selectable from the address terminals are sparsely populated with operable codes. In addition, evaluation logic 30a is constructed in such a manner that codes of all "0" or all "1" will not operate to select a special test mode.

Evaluation logic 30a includes NAND gate 78 which receives lines POR and TRST, and which presents signal RST__ via inverter 79, similarly as evaluation logic 30 of FIG. 5. For the selection of the parallel test function by way of lines CK4 and CK4__, evaluation logic inlcudes NAND gate $84_0$ which has inputs connected to address terminals A0, A2 and A5 from address buffers 11 (or alternatively, directly from the address terminals), and an input connected to line CKBHV from overvoltage detection circuit 32. NAND gate $86_0$ has an input connected to line CKBHV, and has inputs connected to address terminals A1 and A4 from address buffers 11, inverted by inverters $82_0$. Alternatively, true and complement lines from address buffers 11 may communicate equivalent signals to evaluation logic 30a. The outputs of NAND gates $84_0$ and $86_0$ are connected to the inputs of NOR gate $88_0$. The output of NOR gate $88_0$ drives clock line CK4, and clock line CK4__ via inverter $81_0$, similarly as in evaluation logic 30 described hereinabove.

For selection of an alternative test function via clock lines CK1 and CK1__, evaluation logic 30a includes NAND gate $84_1$ which receives at its inputs line CKBHV and the states of address terminals A0, A2 and A5, inverted by inverters $82_1$, and NAND gate $86_1$ which receives at its inputs line CKBHV and the states of address terminals A1 and A4. The outputs of NAND gates $84_1$ and $86_1$ are connected to inputs of NOR gate $88_1$, which drives lines CK1 and CK1__ (via inverter $81_1$).

The operation of evaluation logic 30a will now be described relative to the circuitry for selecting the parallel test mode via clock lines CK4 and CK4__. NOR gate $88_0$ will communicate enabling clock pulses on lines CK4 and CK4__ (i.e., a high logic level on line CK4 and a low logic level on line CK4__) only when its inputs are both at a low logic level. NAND gates $84_0$ and $86_0$ present low logic levels at their outputs only when all of their inputs are at high logic levels. Accordingly, NOR gate $88_0$ presents an enabling clock signal only when the code presented by address terminals A5, A4, A2, A1, and A0 equals 10101, in conjunction with an overvoltage excursion detected by overvoltage detection circuit 32. It should be noted that evaluation logic 30a, via NOR gate 88₁, will drive enabling clock signals on lines CK1 and CK1_, for enabling a second special mode, only when the code presented by address terminals A5, A4, A2, A1, and A0 equals 01010, in conjunction with an overvoltage excursion detected by overvoltage detection circuit 32. In the event of an overvoltage excursion with any other condition than the two codes specifed above (10101 and 01010), none of the enabling clock lines CK4 or CK1 will respond.

Evaluation logic 30a thus presents additional security against inadvertent entry into a special test or operating mode in two ways. First, in memory 1 having only two special test modes, five address terminals are interrogated by evaluation logic 30a. Accordingly, in the event of an overvoltage excursion, the likelihood that a special test code will be selected (or, in the embodiment described hereinabove relative to the multiple clocking required, the likelihood of a false clocking occuring) according to this embodiment of the invention is two out of thirty-two. It should be noted that the likelihood that in the case of evaluation logic 30 described hereinabove, the likelihood that an overvoltage excursion will cause enabling of respective clock lines CK1 or CK4 is certainty, since the minimum number of address terminals (i.e., one) is used for the selection of the special test modes available (i.e., two). Relative to the McAdams et al. article described hereinabove, the likelihood that a special test mode will be entered in the event of an overvoltage excursion is at least nine out of sixteen (one of the modes being a reset code).

Secondly, it should be noted that the codes used in this embodiment of evaluation logic 30a for such enabling are not all "0" or all "1"; receipt of either all "0" or all "1" codes in the event of an overvoltage excursion will not result in enabling clock signals appearing at clock lines CK1 and CK4. As noted above, it is believed that all "0" or all "1" states at the address terminals are the most likely states during power-up or hot socket insertion. It should be noted that the all "0" code in the McAdams et al. reference (see Table IV) selects a parallel read and write operation; the all "1" code has no specified function, but apparently does not reset to normal operation (this being selected by 0111). Since evaluation logic 30a is not responsive to such codes, an additional level of security against inadvertent entry into test mode is provided.

It should be noted that evaluation logic 30a may alternatively be used with a single clocking scheme in test mode enable circuitry 29, i.e., where a single overvoltage excursion can enable a test mode, and will provide the additional security against test mode entry described hereinabove. It is of course contemplated that more than two special test modes may be available for a memory incorporating the features of evaluation logic 30a; additional address terminals would preferably be interrogated in order to maintain the benefits of sparseness in the selection code.

Referring back to FIG. 2, test mode enable circuitry 29 further includes D flip-flops 90 and 92, which are connected in series for each of the test modes selectable by test mode enable circuitry 29. Since, in this example, two test modes are selectable by test mode enable circuit 29, depending upon the state of address terminal A1, two pairs of D flip-flops 90 and 92 are provided in test mode enable circuit 29. For the provision of additional test modes for memory 1, additional pairs of D flip-flops 90 and 92 would be provided.

According to the present invention, a series of overvoltage conditions at address terminal A3 are necessary for entry into a special test mode to be effected. This is accomplished in test mode enable circuit 29, in the case where the series of overvoltage conditions necessary numbers two such cycles, by the provision of two flip-flops 90 and 92 for each test mode. If it is desired, for purposes of further security, that more than two overvoltage cycles are to be required for entry into a special test mode, additional flip-flops would be added to the series sequence of two flip-flops 90 and 92 in FIG. 2. For purposes of avoiding inadvertent test mode entry during hot socket insertion and the like, it is believed that two overvoltage cycles are sufficient, and accordingly flip-flops 90 and 92 are provided in this embodiment of the invention.

Flip-flops

Figure 6:
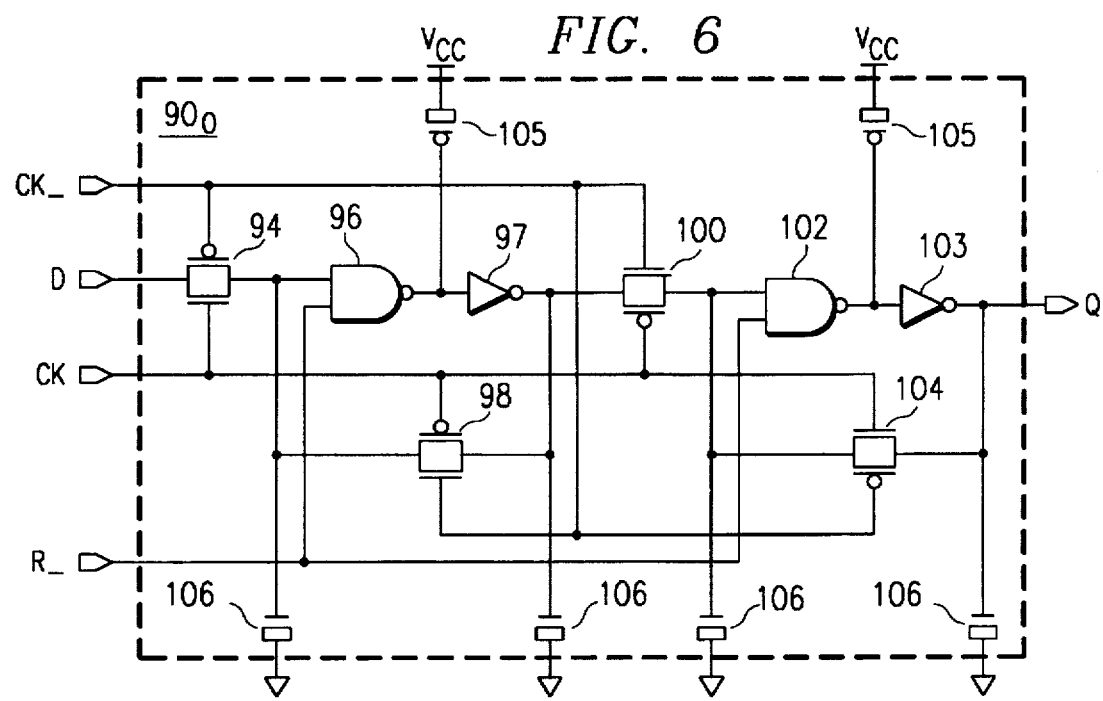
FIG. 6 is an electrical diagram, in schematic form, of the D flip-flops used in the test mode enable circuitry of FIG. 2.

Referring now to FIG. 6, the preferred construction of D flip-flops 90 and 92 will now be described, with reference to D flip-flop 90₀. It should be noted that other latches, bistable multivibrators, or flip-flops of various types (e.g., R-S and J-K flip-flops, and single stage clocked latches) may alternatively be used in place of the D flip-flops 90 and 92 as described herein. It should also be noted that, in this embodiment of the invention, each of flip-flops 90 and 92 are constructed as shown in FIG. 6; alternatively, of course, different designs may be used for flip-flops 90 relative to 92 in test mode enable circuitry 29 according to this invention, if desired.

Flip-flops 90 and 92 each have CK and CK_ inputs for receiving complementary clock signals, and have a data input D and a reset input R_; each of flip-flops 90 and 92 present a non-inverting output Q. Referring to FIG. 6, pass gate 94 consists of complementary MOS transistors gated by the complementary clock inputs CK and CK_, with one side of pass gate 94 receiving the D input. The other side of pass gate 94 is connected to one input of NAND gate 96, which has its other input connected to reset input R_. Pass gate 94 and NAND gate 96, together with inverter 97 which has its input connected to the output of NAND gate 96, serve as the first stage of flip-flop 90₀. The output of inverter 97 is thus the output of the first stage and is connected to the input of the second stage at pass gate 100. The input of NAND gate 96 which is connected to pass gate 94 is also connected to a second pass gate 98, which is gated complementary to pass gate 94; the n-channel and p-channel transistors in pass gate 94 are gated by clock signals CK and CK_, respectively, while the n-channel and p-channel transistors in pass gate 98 are gated by clock signals CK_ and CK, respectively. Pass gate 98 is connected to the output of inverter 97, and serves to latch the state of NAND gate 96 after pass gate 94 is turned off, thus stabilizing the operation of flip-flop 90₀.

The second stage of flip-flop 90₀ is constructed similarly as the first stage, but with complementary clocking from the first stage. Pass gate 100 also consists of complementary MOS transistors gated by clock inputs CK and CK_, but is also gated in an opposite manner from pass gate 94 (i.e., clock inputs CK and CK_ control the opposite transistors in pass gate 100 as they control in pass gate 94). The other side of pass gate 100 is connected to an input of NAND gate 102, which receives reset input R_ at its other input. The output of NAND gate is connected, via inverter 103, to the Q output of flip-flop 90₀. Similarly as in the first stage, pass gate 104 is connected between the output of inverter 103 and the input of NAND gate 102 which is connected to pass gate 100, and pass gate 104 is complementarily clocked from clock inputs CK and CK_ relative to pass gate 100, to latch the input of NAND gate 102 with the output of inverter 103.

In operation, flip-flop 90₀ operates as a conventional two-stage D-type flip-flop. Upon clock input CK going high and CK__ going low, both transistors of pass gate 94 turn on, and communicate the logic state at the D input to NAND gate 96. In the example where a high logic level is presented to the D input, as shown in FIG. 2, and assuming the non-reset condition (i.e., reset input R__ being high), the complement of the D input (i.e., a low logic level) is presented at the output of NAND gate 96, and is inverted by inverter 97. A high logic level thus remains at the output of inverter 97, with pass gates 98 and 100 turned off.

Upon clock input CK__ going high and clock input CK going low, pass gate 94 turns off, and pass gates 98 and 100 are turned on. Pass gate 98 thus connects the input of NAND gate 96 to the output of inverter 97, stabilizing the state of NAND gate 96. Pass gate 100 communicates the high logic level at the output of inverter 97 to the input of NAND gate 102 which, with reset input R__ at a high logic level, is twice inverted by NAND gate 102 and inverter 103. Inverter 103 thus drives a high logic level at the non-inverting Q output. Upon clock input CK__ returning low and clock input CK returning high, pass gate 104 turns on, allowing inverter 103 to drive the input of NAND gate 102 to stabilize this stage of flip-flop $90_0$.

Reset input R__ serves to unconditionally reset flip-flop $90_0$. Upon reset input R__ going to a low logic level, NAND gates 96 and 102 will both present high logic levels at their outputs, regardless of the state of their other inputs. Inverters 97 and 103 will thus each present low logic levels at their outputs, with a low logic level thus appearing at the Q output of flip-flop $90_0$. In the normal operating state, with clock input CK low and clock input OK__ high, the low logic level at the output of inverter 97 drives the other input to NAND gate 96, resetting flip-flop $90_0$ to its initial state. This initial state remains after the return of reset input R__ to a high logic level.

Various capacitors 105 and 106 are shown as connected to particular nodes of flip-flop $90_0$, with capacitors 105 connected to $V_{cc}$, and capacitors 106 connected to $V_{ss}$. These capacitors are generally not included in conventional flip-flops, but are useful in flip-flop $90_0$ according to this embodiment of the invention to preset its state upon power-up of memory 1 into which it is implemented. As discussed above, it is undesirable for memory 1 to enter into a special test mode upon power-up. Accordingly, it is important that the state of flip-flops 90 and 92 be set in such a manner that only upon receipt of proper test mode enable signals (in this case, two overvoltage conditions) does memory 1 enter any special test mode. Accordingly, capacitors 105 couple the outputs of NAND gates 96 and 102 to $V_{cc}$ upon power-up, and capacitors 106 couple the inputs to NAND gates 96 and 102, as well as the outputs of inverters 97 and 103, to $V_{ss}$. This sets flip-flops 90 and 92 in test mode enable circuitry 29 (all similarly constructed), on power-up, in the initial condition of having seen no overvoltage excursions.

FIG. 2 illustrates the connection of flip-flops 90 and 92 in test mode enable circuitry 29. For both of flip-flops $90_0$ and $92_0$, lines CK4 and CK4__ from evaluation logic 30 are connected to the complementary clock inputs CK and CK__, respectively, and line RST__ from evaluation logic 30 is received at the reset input R__. For flip-flop $90_0$, data input D is connected to $V_{cc}$, so that the data clocked in by flip-flop $90_0$ is always a high logic level. As is shown in FIG. 2, flip-flop $92_0$ has its D input connected to the non-inverting Q output of flip-flop $90_0$. Conversely, the complementary clock inputs CK and CK__ of flip-flops $90_1$ and $92_1$ are connected to lines CK1 and CK1__ from evaluation logic 30; the D and R__ inputs of flip-flops $90_1$ and $92_1$ are similarly connected as flip-flops $90_0$ and $92_0$.

The non-inverting Q outputs of flip-flops $92_0$ and $92_1$ are connected to drivers 110. Drivers 110 are conventional buffer/drivers for communicating the output of the Q outputs of flip-flops 92 to the remainder of memory 1, as necessary to effect the enabling and disabling of the special test functions to be performed. For example, in this embodiment, line T is driven by drivers 110 according to the output of flip-flop $92_0$, and is connected to parallel test circuitry 28. A high logic level at the output of flip-flop $92_0$ is thus communicated to parallel test circuitry 28 to enable the parallel test function. Similarly, line T2 is driven by drivers 110, in this embodiment, according to the state of the Q output of flip-flop $92_1$, for the selection of a second special test mode or operation.

Operation of Test Mode Enable Circuitry

Figure 7:
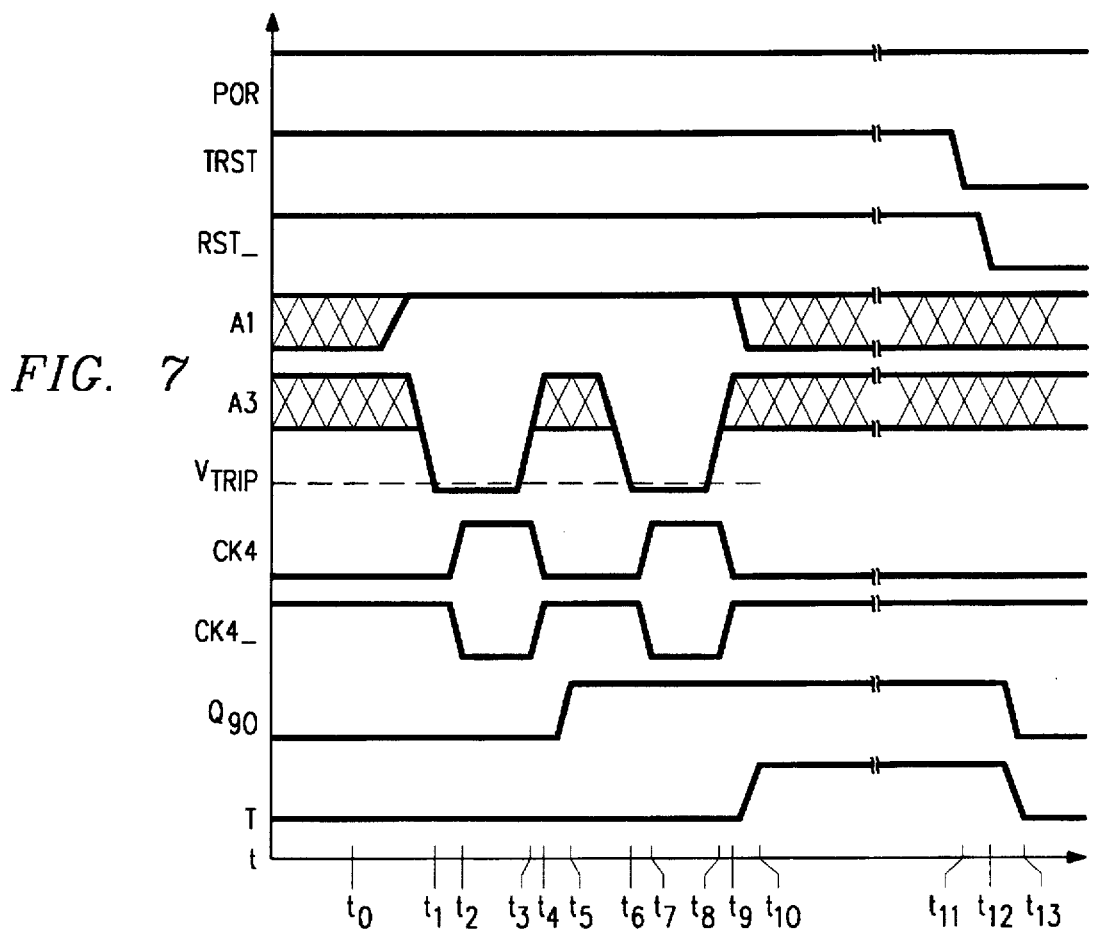
FIGS. 7, 8 and 9 are timing diagrams illustrating the operation of the test mode enable circuitry of FIG. 2 in the memory of FIG. 1.

Referring now to FIG. 7, the operation of test mode enable circuitry 29 according to various conditions will now be described. This operation will be described for the enabling of parallel test circuitry 28 by way of line T; it will of course be understood that other special test functions can of course be selected, depending upon the state of certain address or other inputs such as line A1 which may be interrogated by evaluation logic 30.

This description of the operation of test mode enable circuitry 29 will begin, at time $t_0$, with memory 1 in normal operating mode, but with memory 1 not enabled. Accordingly, line POR is high (memory 1 having powered up for some time), and line TRST is high since memory 1 is not enabled. Accordingly, line RST__ in test mode enable circuitry 29 of FIG. 2 is at a high logic level, and flip-flops 90 and 92 are thus in a state where they can receive and clock data presented at their D inputs upon receipt of the necessary clock signals.

Also at time $t_0$, address terminals A1 and A3 are in their normal state as addresses, making such transitions as are presented during such operation. As such, while the state of these terminals are "don't cares" for purposes of entry into a special test mode, the state of these terminals of course has importance in the operation of memory 1. With address terminals A1 and A3 in this condition, lines CK4 and CK4__ from evaluation logic 30 are low and high, respectively. Flip-flops $90_0$ and $92_0$ are in the initial condition, and accordingly their outputs Q (shown as line T for the case of flip-flop $92_0$) are at low logic levels.

Entry into a special test mode, which in this example is the parallel test mode, begins with a first transition of address terminal A3 to an overvoltage condition. As described hereinabove, in this embodiment of the invention the overvoltage condition is indeed an "undervoltage" condition, where the voltage at address terminal A3 is driven to a voltage $V_{trip}$, which is a certain value below the low logic level voltage, and indeed may be several volts below $V_{ss}$. Address terminal A3 reaches the $V_{trip}$ level in this example at time $t_1$.

As discussed hereinabove relative to FIGS. 3 and 5, as address terminal A3 reaches a voltage at or below $V_{trip}$, a high logic level is driven on line CKBHV. By way of NAND gates 80 in evaluation logic 30, this clocks in the logic state at address terminal A1. In this case, for the enabling of parallel test circuitry 28, address terminal A1 is at a high logic level. As a result, at time $t_2$ in FIG. 7, clock lines CK4 and CK4__ go to high and low logic levels, respectively.

Since flip-flop $90_0$ has its D input tied to $V_{cc}$, a "1" state is clocked into the first stage thereof upon clock lines CK4 and CK4__ going high and low, respectively. As address terminal A3 returns to its nominal range above the level $V_{trip}$ at time $t_3$, line CKBHV returns to a low logic level, and lines CK4 and CK4__ return to low and high levels, respectively, at time $t_4$. This clocks the "1" state into the second stage of flip-flop $90_0$, as described above, so that a high logic level is presented at the non-inverting Q output thereof at time $t_5$.

It should be noted that at time $t_5$, after the first overvoltage excursion at address terminal A3, the high logic level test mode enable signal on line T has not yet been issued. This is of course due to the construction of test mode enable circuitry 29 which has multiple latches (in this example, the two flip-flops 90 and 92) in series for the enabling of the test mode, requiring multiple overvoltage excursions to enable the special test mode. This construction thus provides security against the inadvertent enabling of a special test mode due to noise on the particular terminal used to enable test mode, due to hot socket insertion, loss of power events with subsequent power-up, and the like. While such events may cause a single overvoltage event on the terminal of interest (in this case, address terminal A3), multiple ones of such events are far less likely. Accordingly, by requiring multiple overvoltage excursions for the selection of a special test mode, memory 1 according to this embodiment of the invention provides improved reliability, and avoids the disastrous potential situation where memory 1, once installed in a system, enters into a special test or special operating mode, in which the stored data therein may be irrevocably lost or written over.

At time t6, address terminal A3 has made its second overvoltage transition to a voltage below $V_{trip}$. Since address terminal A1 is still at a high logic level, this causes a high logic level signal to issue on line CK4 and a low logic level signal to issue on line CK4__ at time $t_7$, which clocks the high logic level at the Q output of flip-flop $90_0$ into the first stage of flip-flop $92_0$. At time $t_8$, address terminal A3 returns to its nominal range, above the voltage $V_{trip}$. This results, at time $t_9$, in clock lines CK4 and CK4__ returning to low and high logic levels, respectively, which clocks the high logic level of the Q output into the second stage of flip-flop $92_0$. As a result, at time $t_{10}$, the test mode enable signal line T, driven by drivers 110 from the Q output of flip-flop $92_0$, reaches a high logic level. This communicates to parallel test circuitry 28, and such other circuitry within memory 1 necessary to enable the parallel test function, that the parallel test function is enabled.

It should be noted that this embodiment of the invention requires that the same special test mode selection code be present for both of the overvoltage excursions, in order for the special test mode to be entered. In the above example, this code is a high logic level at address terminal A1. If, for example, address terminal A1 were at a low logic level during the second overvoltage excursion of address terminal A3, clock lines CK4 and CK4__ would not be driven to high and low levels, respectively, since NAND gate $80_0$ would unconditionally have a high logic level at its output (which drives clock line CK4__ directly, and drives clock line CK4 through inverter 82). This requirement of the same code twice to enable the special test mode adds additional security.

It should be noted that alternative coding could easily be included within evaluation logic 30 for further security, and for the selection of additional special test functions with a reduced number of pins. For example, by the addition of additional series of flip-flops 90 and 92, with the appropriate connection of their clock inputs to evaluation logic, such sequencing could easily be accomplished. For example, a third pair of flip-flops $90_2$ and $92_2$ could be included such that flip-flop $90_2$ was clocked responsive to an overvoltage condition on terminal A3 together with a high logic level on terminal A1 (i.e., its clock inputs connected to lines CK4 and CK4__), and that its mated flip-flop $92_2$ was clocked responsive to an overvoltage condition with a low logic level on terminal A1 (i.e., its clock inputs connected to CK1 and CK1__). It is contemplated that many other such combinations, and additional coding and combinations, will now be apparent to those of ordinary skill in the art having reference to this specification.

Figure 2A:
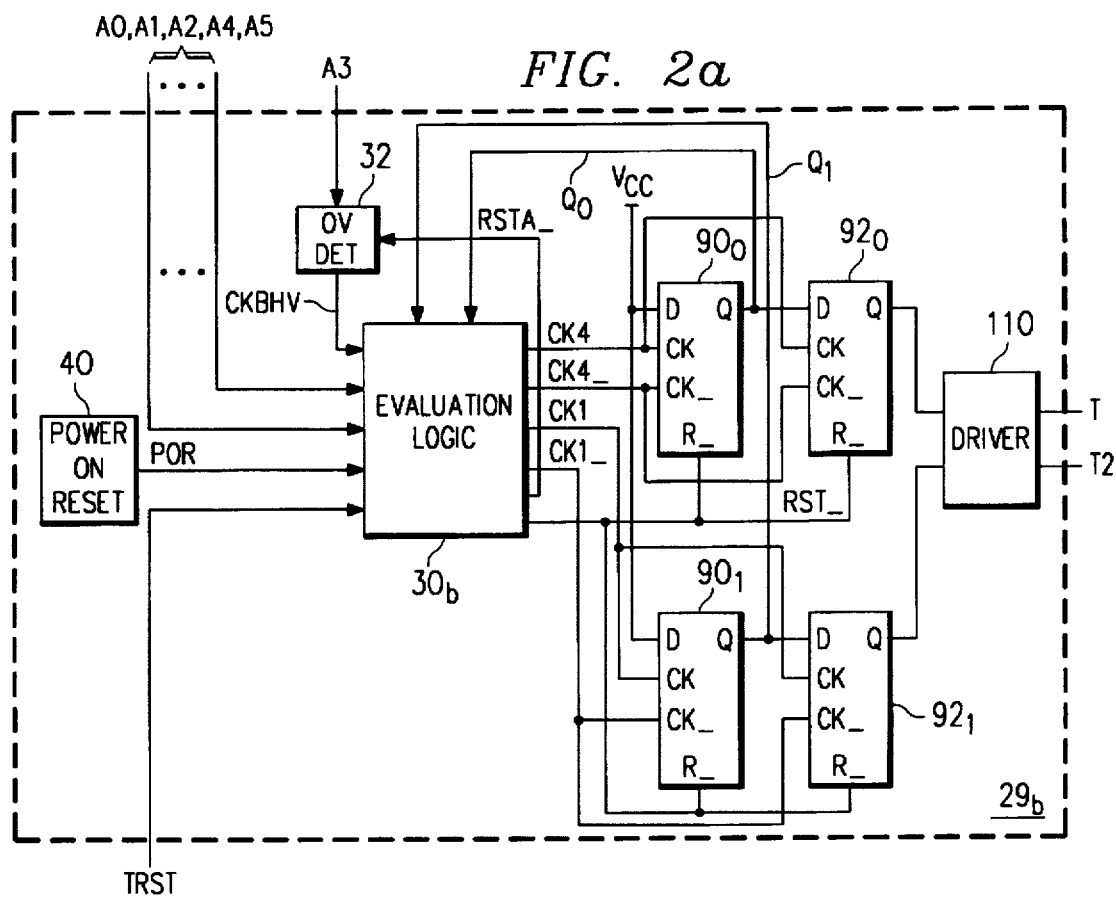
FIGS. 2a and 2b are electrical diagrams, in block form, of alternative embodiments of the test mode enable circuitry of FIG. 1.
Figure 5B:
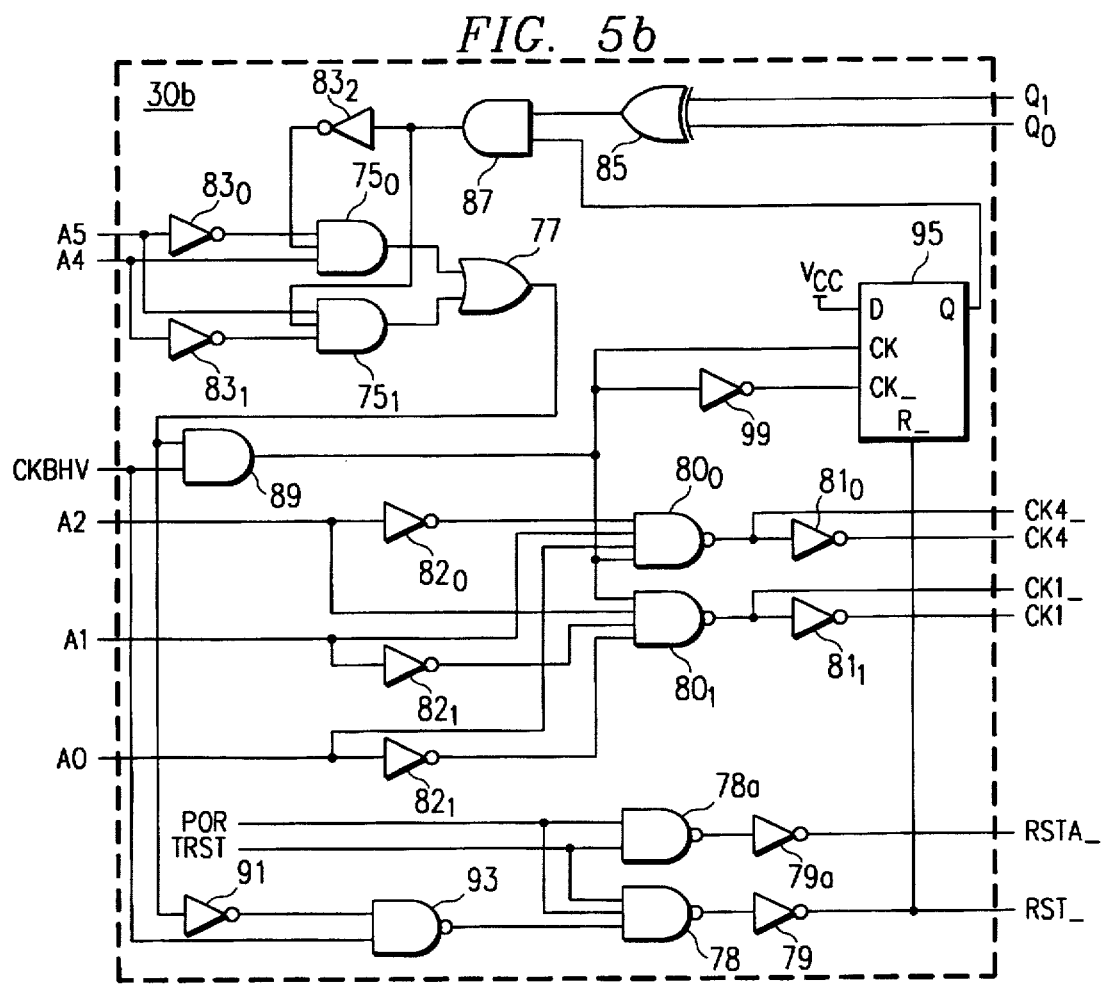

Referring now to FIGS. 2a and 5b in combination, evaluation logic 30b and test mode enable circuitry 29b according to another alternative embodiment of the invention, will be described. Evaluation logic 30b according to this alternative embodiment provides additional security against the inadvertent entry into test mode, according to multiple features. It should be noted that, while evaluation logic 30b includes the combination of these features, it is contemplated each of the features may be used individually, as the combination of these features is not necessary to achieve some of the benefits thereof.

Test mode enable circuitry 29b of FIG. 2a differs from test mode enable circuitry 29 of FIG. 2, by the provision of a second reset signal line RSTA__ connected to overvoltage detection circuit 32; as will be evident hereinbelow, evaluation logic 30b generates reset signal lines RST__ and RSTA__ responsive to different combination of signals. Line RSTA__ controls overvoltage detection circuit 32 in the same manner as line RST described hereinabove. Test mode enable circuitry 29b further connects the outputs of flip-flops $90_0$ and $90_1$ to evaluation logic 30b, to provide feedback of the current state of test mode enable circuitry 29b into evaluation logic 30b. As will be evident hereinbelow, such feedback provides additional security against inadvertent test mode entry.

Referring to FIG. 5b, the construction of evaluation logic 30b according to this embodiment will be described. Evaluation logic 30b receives inputs on lines POR, TRST, CKBHV, and from address terminals A0, A1, A2, A4, and A5, as in the case of evaluation logic 30a of FIG. 5a; evaluation logic 30b presents outputs on lines RST__, CK4, CK4__, CK1 and CK1__. In addition, evaluation logic 30b receives inputs on lines Q0 and Q1 from flip-flops $90_0$ and $90_1$ of FIG. 2a, and also presents an output on line RSTA__ to overvoltage detection circuit 32, as noted above.

Line RST__ is connected to the R__ inputs of flip-flops 90 and 92, for resetting the same upon a high logic level thereat. Similarly as in evaluation logic 30 and 30a, line RST__ is driven by inverter 79 according to the output of NAND gate 78, which has lines POR and TRST at its inputs. Similarly, line RSTA__ is driven by inverter 79A from NAND gate 78A, with lines POR and TRST at the inputs of NAND gate 78A. In addition, NAND gate 78 receives, at a third input, the output of NAND gate 93, which receives at its inputs line CKBHV from overvoltage detection circuit 32, and from OR gate 77 via inverter 91.

OR gate 77 is the final output stage of logic in evaluation logic 30b which detects the state of test mode enable logic 29b in evaluating the signals provided thereto and determining whether or not a special test mode enable operation has occurred. Lines Q0 and Q1 are connected to the inputs of exclusive-OR gate 85, which has its output connected to a first input of AND gate 87. The second input of AND gate 87 receives the Q output of D-type flip-flop 95, which has its D input tied to $V_{cc}$, its R__ input connected to line RST__, and its clock and complement clock inputs (CK and CK__, respectively) connected to the output of AND gate 89, inverted by inverter 99 in the case of the line connected to the CK__ input. AND gate 89 receives line CKBHV at one input, and the output of OR gate 77 at the other.

Certain of the address terminals are evaluated by NAND gates $80_0$ and $80_1$, as in evaluation logic 30a. In this case, NAND gate $80_0$ has inputs connected to address terminal A2, inverted by inverter $82_0$, and to address terminals A0 and A1; conversely, NAND gate $80_1$ has its inputs connected to address terminals A0 and A1, inverted by inverters $82_1$, and to address terminal A2. Each of NAND gates 80 have an input connected to the output of AND gate 89, discussed above. NAND gates $80_0$ and $80_1$ drive complementary lines CK4 (and CK4__) and CK1 (and CK1__), directly and inverted by inverters 81, as above.

In evaluation logic 30b according to this embodiment, address terminals A4 and A5 are evaluated by additional logic, together with the state of flip-flops 90 communicated by lines Q0 and Q1. The output of AND gate 87 drives one input of AND gate $75_1$ and (after inversion by inverter $83_2$) AND gate $75_0$. AND gates 75 also receive the state of lines A4 and A5, both directly and inverted by inverters 83, depending upon the desired code. In the embodiment of FIG. 5b, AND gate $75_0$ receives address line A4 non-inverted and address line A5 inverted, and AND gate $75_1$ receives address line A4 inverted and address line A5 non-inverted. The outputs of AND gates are connected to the input of OR gate 77.

The operation of evaluation logic 30b will now be described, relative to a special operating mode selection operation after memory 1 is in a normal operating mode. This operation will be performed according to a sequence of overvoltage excursions, as in the prior embodiments. In this embodiment, however, evaluation logic 30b requires the sequence 01011 and 10011 to be presented to the address terminals (A5, A4, A2, A1 and A0, in that order) for the selection of the parallel test mode enabled by clock signals CK4 and CK4__.

In the initial state, lines POR and TRST will be at a high logic level, so that line RST__ will be at a high logic level, allowing test mode enable circuitry 29b to respond to the initiation of the special operating mode (i.e., special test mode). Lines Q0 and Q1 from the outputs of flip-flops $90_0$ and $90_1$ are both at low logic levels, and accordingly exclusive-OR gate 85 is presenting a low logic level to AND gate 87. Also in this state, (assuming that memory 1 is now not enabled from chip enable terminals E1 and E2), the Q output of flip-flop 95 is also at a low logic level. The output of AND gate 87 is thus a low logic level, which forces the output of AND gate $75_1$ to a low logic level. Address terminals A4 and A5 are thus evaluated by AND gate $75_0$, which will present a high logic level if line A4 is high and if line A5 is low. In this case, with the code 01011 presented, OR gate 77 will present a high logic level at its output.

In the event of an overvoltage excursion at terminal A3, line CKBHV will be at a high logic level. This will cause AND gate 89 to issue a high logic level at its output, clocking the high logic level of $V_{cc}$ into flip-flop 95. In addition, the output of AND gate is connected to one input of each of NAND gates 80, allowing the states of address terminals A0, A1 and A2 to be evaluated. Furthermore, since the output of OR gate 77 is high (due to code 01011 presented), line RST__ from the output of inverter 79 will be high due to the output of NAND gate 93, and lines POR and TRST, all being at a high logic level.

With the code 01011 presented at the address terminals in conjunction with the overvoltage excursion, lines CK4 and CK4__ will be driven high and low, respectively, by NAND gate $80_0$ and inverter $81_0$. As will be described below, at the end of the overvoltage excursion at address terminal A3, flip-flop $90_0$ to clock in a high logic level and place it at its Q output, which is connected by line Q0 of FIG. 5b to exclusive-OR gate 85; line Q1 will remain low, as this state was not been clocked into flip-flop $90_1$. Therefore, after the overvoltage excursion on line A3 with the valid code of 01011 presented to the appropriate address terminals, the Q output of flip-flop 95 and the output of exclusive-OR gate 85 will both be at a high logic level, causing the output of AND gate 87 to be high, and enabling AND gate $75_1$ to evaluate address terminals A4 and A5 for the next excursion. In this way, evaluation logic 30b changes the valid code from one overvoltage excursion to the next, as now OR gate 77 will only present a high logic level responsive to address terminals A5 and A4 receiving the code 10, rather than 01 in the first cycle.

It should be noted that only by the receipt of a valid code in the first excursion does evaluation logic 30b change the code. This is due to AND gate 87, which requires both an overvoltage excursion with a valid code in order to set flip-flop 95, and that there be one and only one valid code received (i.e., only one of lines Q0 and Q1 can be high).

Upon receipt of the second valid code (10011) in conjunction with an overvoltage excursion, clock lines CK4 and CK4__ will be driven high and low, respectively, and return. As will be described in further detail hereinbelow, such a sequence will generate a signal on line T, selecting the parallel test mode.

This selection method, where different codes are required for multiple overvoltage excursions, provides additional security against inadvertent test mode entry. If the overvoltage excursions are due to noise or hot socket insertion, for example, it is highly unlikely that the proper code sequence (for example, 01011 followed by 10011) will be present at the address terminals at the same time as the overvoltage excursions. The sequence of valid codes required provides even further security, considering that the valid codes are quite sparse within the set of available values at the address terminals.

Evaluation logic 30b also provides additional security by way of various reset functions. Firstly, in the event that an invalid code is received at address terminals A4 and A5 together with an overvoltage excursion, the output of OR gate 77 will be at a low logic level which, after inversion by inverter 91, will cause the output of NAND gate 93 to go to a low logic level. This will cause a low logic level to appear on line RST__, which will reset flip-flops 90 and 92 in test mode enable circuitry 29, and flip-flop 95 in evaluation logic 30b. Accordingly, evaluation logic 30b not only requires that two different valid codes be received to enable the special test mode, but that the two codes be directly one after the other, without the receipt of an invalid code therebetween. This further enhances the security of the special test mode selection.

It should be noted that overvoltage detection circuit 32 remains enabled in the event of such an invalid code; this allows for the continued receipt of overvoltage excursions after an invalid code has been received.

Of course, longer or different sequences of codes can be implemented in evaluation logic 30b by the addition of appropriate logic therefor. For example, all of the address terminals could be evaluated with additional AND or NAND functions selected by AND gate 87 as in the case of address terminals A4 and A5, so that all bits would have to change for special test mode to be enabled. It is contemplated that other alternatives and modifications will now be apparent to those of ordinary skill in the art, having reference to this description.

Figure 2B:
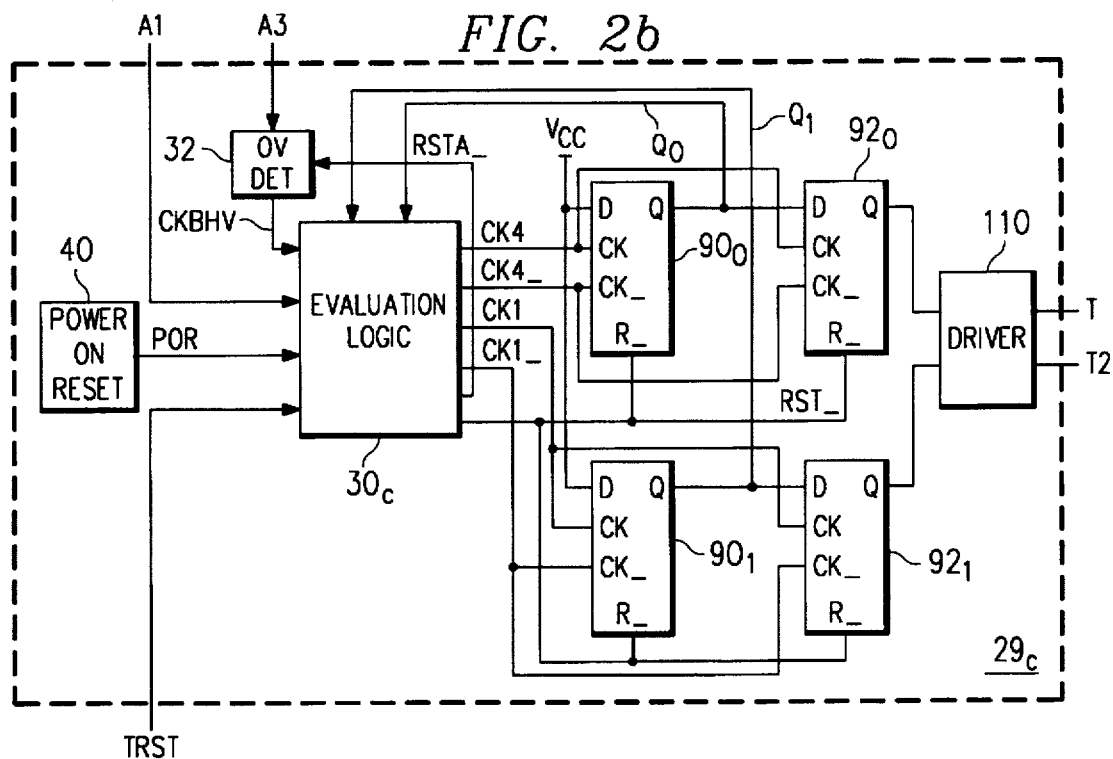
Figure 5C:
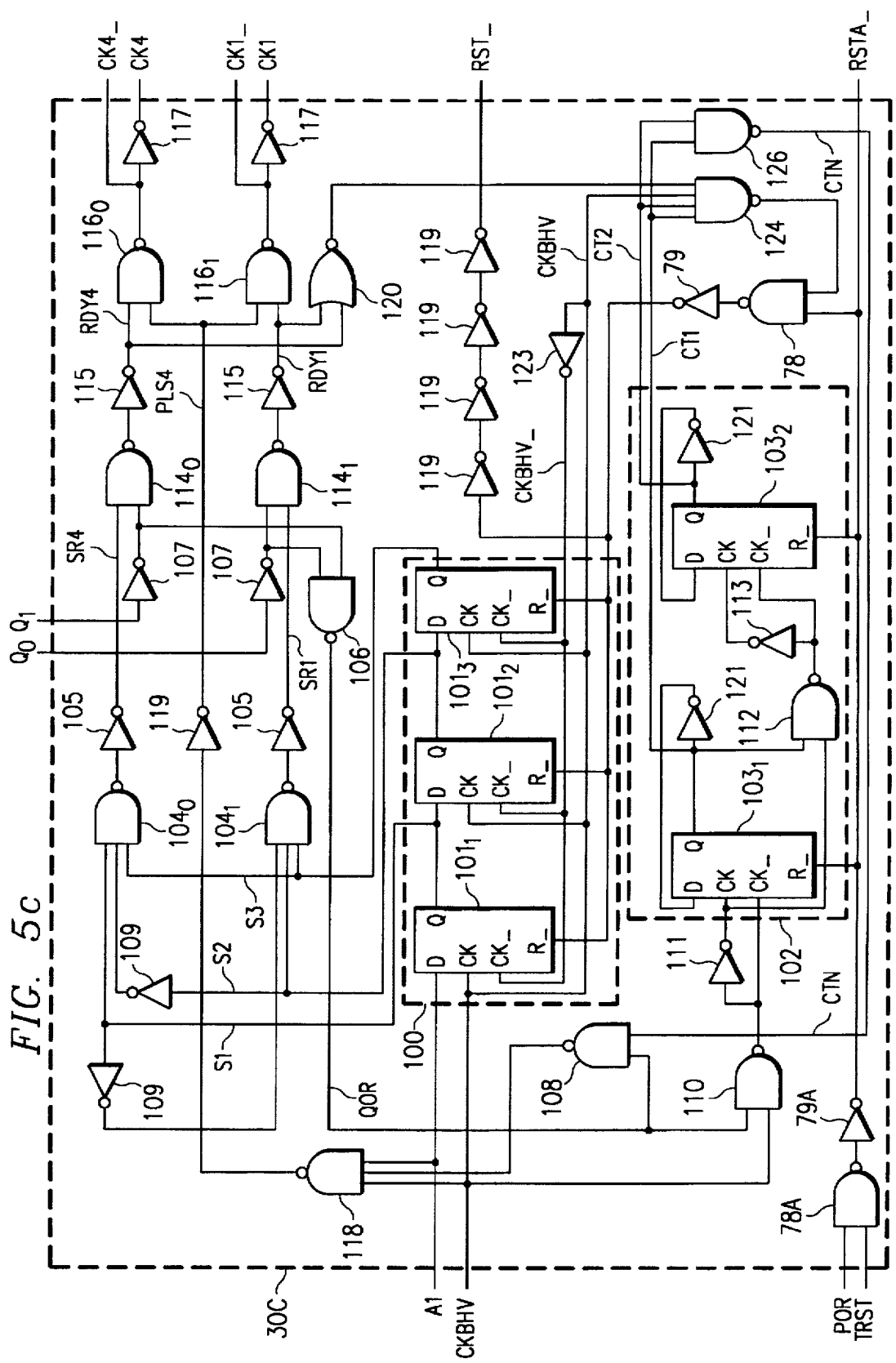

Referring now to FIGS. 2b and 5c in combination, evaluation logic 30c and test mode enable circuitry 29c according to yet another alternative embodiment of the invention will be described. Evaluation logic 30c according to this alternative embodiment provides additional security against the inadvertent entry into test mode in the situation where only a minimum number of terminals for provision of a special test mode code are available. Where only one terminal, for example, is available for the presentation of a special test mode code, the embodiment of FIGS. 2b and 5c provide security against inadvertent entry into test mode by requiring a particular serial sequence prior to entry into test mode. Referring to FIG. 2b, test mode enable circuitry 29c illustrates that only a single address terminal A1 is connected to evaluation logic 30c. Evaluation logic 30c includes circuitry for evaluating the serial data received at terminal A1 in conjunction with overvoltage excursions, and for controlling the clocking of flip-flops 90 and 92 according to this sequence.

Referring now to FIG. 5c, the construction of evaluation logic 30c for evaluating a serial data stream from address terminal A1, and for controlling the clocking of flip-flops 90 and 92 in test mode enable circuitry 29, will now be described. Evaluation logic 30c includes a shift register 100 which receives and stores a series of data states on address terminal A1, as clocked in by overvoltage excursions detected by overvoltage detection circuit 32 and communicated on line CKBHV. Evaluation logic 30c, as will be described in detail hereinbelow, evaluates the state of shift register 100 and, upon receipt of another pulse of line CKBHV in conjunction with a valid data state, issues a first clock pulse to flip-flops 90 in test mode enable circuitry 29c.

Evaluation logic 30c further includes counter 102 which, in this embodiment, begins counting pulses on line CKBHV once the first clock pulse has been issued by evaluation logic 30c. Upon the end of the sequence (four pulses in this embodiment), counter 102 enables the comparison of the last data state and the state of shift register 100; if a valid code has been received, and if it is the same as the code which caused the first clock pulse to flip-flops 90 in test mode enable circuitry 29c, the second clock pulse will be issued and the special test mode will be enabled. If the second code is not valid, or if it is different from the prior valid code accepted, shift register 100 and flip-flops 90 and 92 in test mode enable circuitry 29c are reset via line RST__, and the sequence for re-entering a special operating or test mode must begin again.

Referring to FIG. 5c, the detailed construction of evaluation logic 30c will now be described, in conjunction with its operation as it enables a special test mode. Lines Q0 and Q1 from flip-flops $90_0$ and $90_1$ are received at inputs of NAND gate 106, after inversion by inverters 107; accordingly, the output of NAND gate 106 on line QOR is the logical OR of lines Q0 and Q1. Line QOR is connected to a first input of NAND gate 108, which has its output connected an input of NAND gate 118. In the initial condition, with flip-flops 90 both having logic low states at their output, line QOR will be low, causing the output of NAND gate 108 to be at a high logic level. Lines Q0 and Q1 are also connected to inputs of NAND gates $114_1$ and $114_0$, respectively.

Shift register 100 includes three D-type flip-flops 101, connected in series with one another, and presents the outputs of flip-flops $101_1$, $101_2$ and $101_3$ on output lines S1, S2 and S3, respectively. Flip-flops 101 are clocked by line CKBHV (with the CK__ inputs of flip-flops 101 clocked by line CKBHV after inversion by inverter 123). The input of the first flip-flop $101_1$ is connected to address terminal A1. Accordingly, for each pulse on line CKBHV indicating an overvoltage excursion on terminal A3, the logic state at address terminal A1 will be clocked into successive stages of shift register 100. It should be noted that shift register 100 is reset by way of line RST__ from NAND gate 78 (via inverter 79), similarly as in the case of FIG. 5b discussed hereinabove, but with an additional input from counter 102 which will be described further hereinbelow.

Upon three pulses of line CKBHV in this embodiment, a three-bit code will have been shifted into shift register 100 from address terminal A1. The outputs S1, S2 and S3 are presented to NAND gates 104, via inverters 109 for certain lines, according to the desired code. Accordingly, NAND gate $104_0$ will present a high level on line SR4 to NAND gate $114_0$ (via inverter 105) if the code shifted into shift register 100 is 101 (corresponding to the outputs S3, S2__, and S1, respectively). The code for NAND gate $104_1$ to present a high level on line SR1 is 110, in this embodiment. Since no clock pulses have been issued to flip-flops 90 at this time, the other input to NAND gates 114 are high logic levels from lines Q0 and Q1, inverted by inverters 107. In this example where shift register 100 is presenting the code 101, line RDY4 will thus be at a high logic level, with line RDY1 low due to line SR1 from NAND gate $104_1$ being low.

Upon the fourth pulse on line CKBHV, if address terminal A1 is at a high logic level, the output of NAND gate 118 will be low. After inversion by inverter 119, line PLS4 will thus be at a high logic level which, together with the high logic level on line RDY4, causes NAND gate $116_0$ (having lines PLS4 and RDY4 at its inputs) to present high and low logic levels on lines CK4 and CK4__, respectively, to flip-flop $90_0$ of test mode enable circuitry 29c in FIG. 2b. Accordingly, the first serial code required to enable the special test mode of parallel read/write, in this embodiment, is a serial code of 1011 at address terminal A1, clocked in by overvoltage excursions at address terminal A3. Accordingly, line Q0 from the output of flip-flop $90_0$ will be at a high logic level (upon the return of line CKBHV to a low level at the end of the overvoltage excursion at terminal A3).

With line Q0 high, line QOR will also be at a high logic level. Line QOR is also connected to an input of NAND gate 110 which, via inverter 111, clocks counter 102. Counter 102 is a conventional two-bit counter, which includes D flip-flops $103_1$ and $103_2$. The outputs of flip-flops 103 are connected to their D inputs via inverters 121, and the output of flip-flop $103_1$ is gated with the output of inverter 111 via NAND gate 112 and inverter 113 to control the clocking of D flip-flop $103_2$. The outputs of flip-flops $103_1$ and $103_2$ are on lines CT1 and CT2, respectively. Accordingly, with each pulse of line CKBHV, counter 102 will count according to the sequence 00, 01, 10, 11 (line CT2 being the more significant bit in the count).

The next sequence of three pulses of line CKBHV will thus cause counter 102 to count to its 11 state. Lines CT1 and CT2 are connected to inputs of NAND gate 126 which accordingly drives a high logic level at its output, on line CTN, until the count has reached 11. The output of NAND gate 108, having its other input connected to line CTN, thus has been at a low logic level since line QOR has also been at a high logic level (line Q0 being high). Accordingly, counter 102 has inhibited clock pulses on line CKBHV from generating a high logic level on line PLS4 during this time; in this way, an incorrect code does not cause the early issuing of clock pulses to flip-flops 90 and 92. It should be noted that these pulses on line CKBHV have continued to shift data into shift register 100, for comparison at the end of the sequence as will be described hereinbelow.

Upon counter 102 reaching the 11 state, line CTN goes to a low logic level. NAND gate 108 thus presents a high logic level to NAND gate 118, which allows the states of lines A1 and CKBHV to control the output of NAND gate 118. If a high logic level is present at terminal A1 at the time of the fourth pulse of line CKBHV, line PLS4 will again go to a high logic level. The second clock pulse on lines CK4 and CK4_ (in this example) will thus be issued by NAND gate $116_0$ if line RDY4 is again at a high logic level (i.e., shift register 100 is presenting the code 101), and if line Q1 is at a low logic level. It should be noted that the provision that line Q1 from flip-flop $90_0$ be at a low logic level prevents the issuing of a clock pulse to one series of flip-flops 90 and 92 after a first clock pulse has been issued to another series of flip-flops 90 and 92.

Evaluation logic 30c also includes reset circuitry in the event that the second sequence of codes is incorrect. If, in the above example, shift register 100 is not issuing the 101 code, line RDY4 will be at a low logic level. With line Q0 high from the first clock pulses to flip-flops $90_0$ and $92_0$, line RDY1 will be at a low logic level regardless of the code in shift register 100. NOR gate 120 has its inputs connected to lines RDY1 and RDY4, and will thus issue a high logic level at its output to NAND gate 124. NAND gate 124 also receives the state of counter 102 on lines CT1 and CT2 at its inputs, together with line CKBHV, and has its output connected to an input of NAND gate 78 which drives line RST_ via inverters 119, and which resets shift register 100 from inverter 79. Accordingly, if the state of counter 102 is 11, and if the valid code is not received (i.e., lines RDY1 and RDY4 both low) at the time of the fourth pulse of line CKBHV, the output of NAND gate 124 will go to a low logic level, causing NAND gate 78 and inverter 79 to reset flip-flops 101 in shift register 100, and to reset flip-flops 90 and 92 in test mode enable circuitry 29c via line RST_. Accordingly, upon receipt of the incorrect code, even after the first clock pulse has been issued to flip-flops 90 and 92, evaluation logic 30c forces a full sequence to be received prior to entry into test mode.

Evaluation logic 30c according to this alternative embodiment of the invention thus further provides additional security against inadvertent entry into a special test mode, even if only one terminal is available for receipt of the code. This additional security is provided by a sparse serial code, i.e., the number of bits in the serial code is greater than the minimum required to uniquely select from the available test modes. In this example, two sequences of four bits each are required to select one of two test modes. Furthermore, it should be noted that codes other than all "0" or all "1" are required, further increasing the level of security.

Regardless of the mode for selecting and enabling a special test mode, upon the enabling of the special test mode (particularly in the case of parallel test), address terminals A1 and A3 may have additional functions, such as the selection of the address locations to be written to or read from in the special test mode. Accordingly, while address terminals A1 and A3 are "don't cares" for purposes of enabling the special test modes once such enabling has occurred (and are shown in FIG. 7 as such), the states of address terminals A1 and A3 may have importance in the accomplishment of the desired test.

Referring still to FIG. 7, the disabling of the special test mode upon selection of the memory 1 by way of chip enable will now be described. As noted hereinabove, if the special test mode is inadvertently entered during normal operation, a first conceivable result is that the data stored in the memory, or data written to the memory in the expectation that it will be stored, may be lost. Accordingly, the features described hereinabove where multiple overvoltage excursions are required for the enabling of test mode provide additional security against such loss of data.

In addition, however, such inadvertent entry becomes even more serious if there is no controllable way of then disabling the test mode and re-entering the normal operation mode. As noted in the McAdams et al. article cited hereinabove, in memories with special test modes enabled by overvoltage conditions, a prior technique for placing the memory back into normal operating mode is by way of performing an additional overvoltage excursion, together with a code which indicates that normal operating mode is to be reentered. However, in the event that the test mode is inadvertently entered, especially in a system context, re-entry into normal operating mode requires first that the improper mode be detected, and secondly that an overvoltage excursion be applied to the device, with the proper code, so that normal operation can be regained. However, the ability to detect the errors generated by being unexpectedly in test mode, much less to determine that the error is due to being in test mode, is a relatively complex operation for many systems. Furthermore, the system may not have the overvoltage capability necessary to exit test mode. Accordingly, nothing short of complete system shutdown is required in such systems to exit the unintentionally enabled special test mode, assuming that such enabling is detected in the first place.

According to this embodiment of the invention, as described above relative to evaluation logic 30 and FIGS. 1 and 2, memory 1 can be placed in special test mode, and can remain there, only during such time as memory 1 is not enabled. As discussed above relative to FIG. 1, memory 1 according to this example is enabled by having terminal E1 at a low logic level and terminal E2 at a high logic level. Responsive to this enabled condition, line TRST is at a low logic level, which causes line RST_ in evaluation logic 30 to also be at a low logic level. As discussed hereinabove, such a state causes flip-flops 90 and 92 to all be placed and held in the reset state, forcing the Q outputs of flip-flops 92 to unconditionally be at low logic levels. The special test modes cannot be enabled, nor can they remain enabled, in such a case.

Referring to FIG. 7, such an exit from special test mode due to the de-selection of memory 1 will now be described. At time $t_{11}$, the special test mode for parallel test is shown as enabled, as line T is at a high logic level. At time $t_{12}$, however, line TRST makes a high-to-low transition; such a transition is generated by AND gate 25 and inverter 27 shown in FIG. 1, responsive to both of the chip enable input terminals E1 and E2 receiving the proper logic levels so as to enable memory 1. Responsive to line TRST going to a low logic level, evaluation logic 30 will issue a low logic level on line RST_. As discussed above relative to FIG. 6, flip-flops 90 and 92 in test mode enable circuitry 29 are all responsive to line RST_ to be reset into the state at which they present a low logic level at their respective Q outputs. As a result, drivers 110 will drive a low logic level on line T (and line T2, as well) at time $t_{13}$, responsive to the Q output of flip-flop $92_2$ being driven low by the low logic level on line RST_.

Therefore, according to this embodiment of the invention, the exit from special test mode is effected merely by the enabling of memory 1 by way of the chip enable function. Such enabling is of course available to the system user of memory 1, since enabling by chip enable is a necessary and specified function of this example of memory 1. Furthermore, in particularly simple systems where there is no potential for bus conflict, for example where only one bank of memory is used, the chip enable terminals E1 and E2 may be hard-wired into the enable states. Such hardwiring would, for this embodiment of memory 1, negate the possibility that the special test mode could be entered inadvertently during system operation, as line TRST would remain at a low logic level. Data loss due to entry into test mode could not occur, in such an application.

Figure 8:
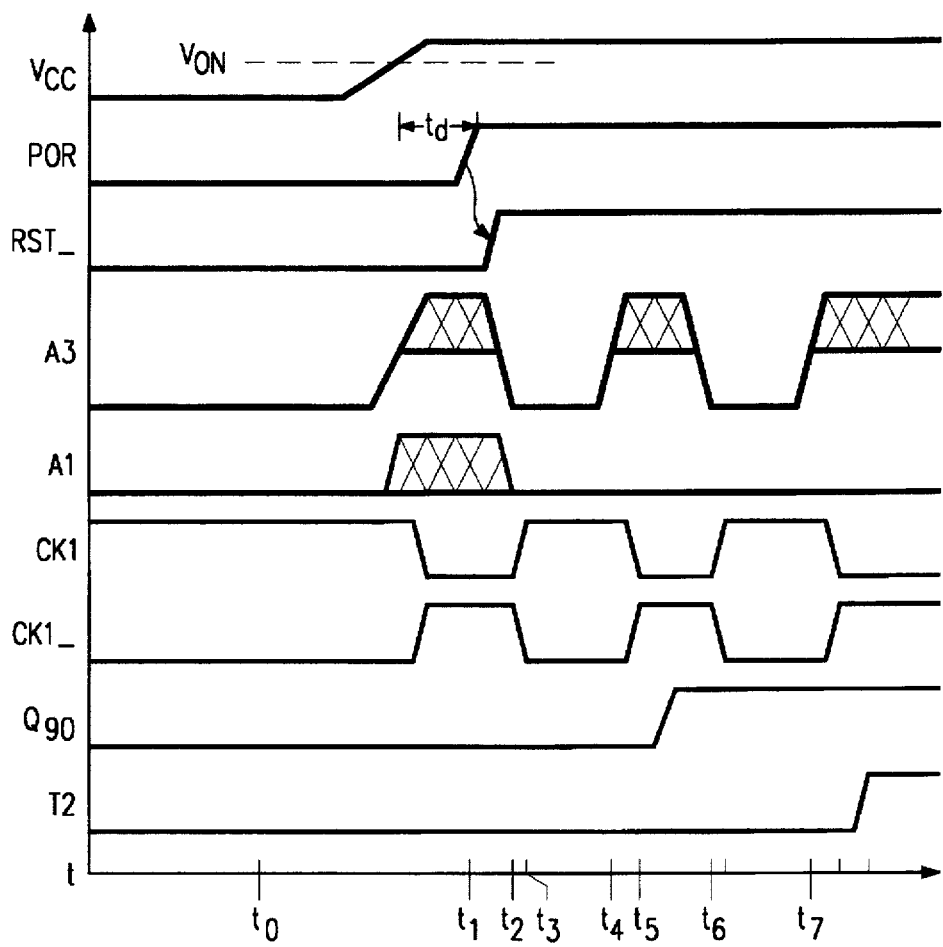

Referring now to FIG. 8, the operation of test mode enable circuitry 29 responsive to a power-up sequence will now be described. As described hereinabove, test mode enable circuitry 29 includes power-on reset circuit 40 which generates a low logic level on line POR initially upon power-up, and generates a high logic level thereon at a point in time after a $V_{cc}$ voltage threshold has been reached.

At time $t_0$, memory 1 is in a powered-down condition, as shown by the top line showing power supply voltage $V_{cc}$, but with a negative voltage applied to terminal A3. Such a condition, as noted hereinabove, may occur during power-up of the power supply $V_{cc}$ or in a "hot socket" insertion of memory 1 into a previously powered up location, with power supply voltage $V_{cc}$ reaching memory 1 later than the voltage is applied to terminal A3. In whatever case, address terminal A3 is in an overvoltage condition at this time, relative to $V_{cc}$ and also perhaps to $V_{ss}$. Responsive to this state at terminal A3, and with address terminal A1 indicating a code (arbitrarily selected for purposes of this explanation as at a low logic level, as would be likely during powerup), evaluation logic 30 will generate high and low signals on lines CK1 and CK1_, respectively. It should be noted that this overvoltage condition at terminal A3, due to the reasons specified hereinabove, is not intentionally presented, nor is it intended in this situation that the special test mode be enabled with this condition. Instead, this overvoltage excursion at terminal A3 is an attribute of the status of power supply $V_{cc}$, relative to address terminal A3, generated by the power-up or hot socket condition.

These signals on lines CK1 and CK1_ would cause flip-flop $90_1$ to latch in the high logic level at its D input, but for the presence of power-on reset circuit 40 in test mode enable circuit 29. During such time as $V_{cc}$ is at a low level, below the voltage $V_{on}$ shown in FIG. 8, and for a period of time thereafter shown as $t_d$ in FIG. 8, line POR is maintained by power-on reset circuit 40 at a low logic level. Accordingly, evaluation logic 30 generates a low logic level signal on line RST_ to flip-flops 90 and 92 in test mode enable circuitry 29, ensuring that the Q outputs thereof remain at a low logic level. As shown in FIG. 8, both the Q output of flip-flop $90_1$ and line T2, corresponding to the Q output of flip-flop $92_1$ as driven by drivers 110, remain at a low logic level during this time, regardless of the overvoltage excursion at terminal A3.

After power supply voltage $V_{cc}$ has exceeded the limit $V_{on}$ at which power-on reset circuit 40 trips, and after the time delay $t_d$ built into power-on reset circuit 40, line POR is driven to a high logic level at time $t_1$. Responsive to line POR going to a high level, evaluation logic 30 will present a high logic level on line RST_ to flip-flops 90 and 92. As a result, flip-flops 90 and 92 are now responsive to signals at their clock inputs. Further responsive to power supply voltage $V_{cc}$ reaching nominal levels, address terminal A3, which was in an overvoltage condition due to the above-described circumstances, also returns to nominal levels. Normal operation of memory 1 can now continue.

In the operational example of FIG. 8, the special test mode associated with test mode enable line T2, selected by address terminal A1 at a low level during the overvoltage excursions, is to be enabled. Accordingly, as in the prior case, at time $t_2$ a first overvoltage (in this case, undervoltage) condition is intentionally presented to address terminal A3 during such time as address terminal A1 is at a low logic level, to select this special test mode. Responsive to this condition, evaluation logic 30 places high and low logic levels on lines CK1 and CK1_, respectively, at time $t_3$. This causes a transition of the first stage of flip-flop $90_1$, so that it presents a high logic level at its output. Upon return of address terminal A3 to nominal levels at time $t_4$, low and high logic levels are placed on lines CK1 and CK1_, respectively, at time $t_5$, which clocks the high logic level into the second stage, and to the Q output, of flip-flop $90_1$.

It should be noted that, while the overvoltage excursion of address terminal A3 which occurred at time $t_1$ was the second such excursion in this sequence, test mode enable circuitry 29 treated this excursion as the first such sequence; this is evident with line T2 remaining at a low logic level. Test mode enable circuitry 29 thus prevents overvoltage conditions during power-up or power-down from causing inadvertent enabling of a special test function by, in effect, locking out the effects of such conditions on test mode enable circuitry 29. Accordingly, only those overvoltage conditions which occur after full power-up are accepted as valid by test mode enable circuitry 29. As illustrated in FIG. 8, the second such excursion at terminal A3 therefore counts only as the first.

Accordingly, the special test mode is then enabled by the second overvoltage excursion at terminal A3, occurring at time $t_6$, which together with the return of terminal A3 to nominal levels at time $t_7$, generates the high logic level signal at line T2, in the same manner as described hereinabove relative to FIG. 7.

Output Enable in Test Mode

Figure 9:
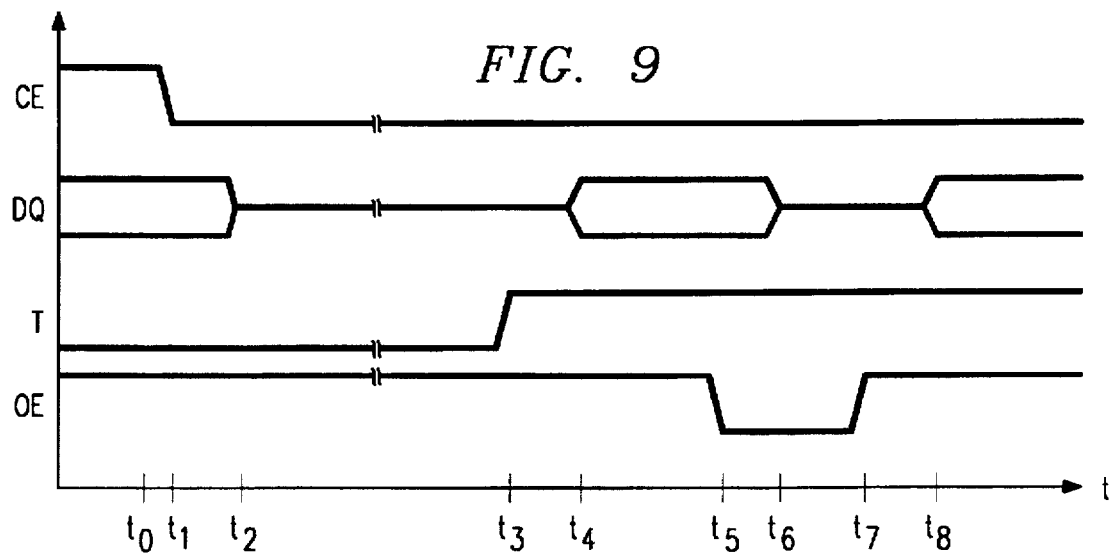

Referring to FIGS. 1 and 9, the control of output buffers 22 as a result of the enabling of a special test mode by test mode enable circuitry 29 will now be described. As shown in FIG. 1 and as described hereinabove, this embodiment of memory 1 includes OR gate 33 which receives line CE from the output of AND gate 25, and line T from test mode enable circuitry 29, at its inputs. The output of OR gate 33 is connected to an input of AND gate 26, the output of which controls the enabling and disabling of output buffers 22. For purposes of explanation, output buffers 22 are enabled in this example by a high logic level at the output of AND gate 26.

It should be noted that line T, as described above relative to FIGS. 2 through 7, carries the signal which enables one of the two special test modes in memory 1. For purposes of controlling output buffers 22 in memory 1, it may be useful to communicate the logical OR of the test mode enable signals, in this embodiment lines T and T2, to the input of OR gate 33 of FIG. 1. This will allow the selection of any one of the special test modes to control output buffers 22 in the manner to be described hereinbelow. Alternatively, especially in the case where more than two special test modes are available, appropriate logic may be implemented so that enabling of only certain selected ones of the special test modes may affect the enabling and disabling of output buffers 22; the construction of such logic will, of course, be apparent to one of ordinary skill in the art based upon the desired control of output buffers 22 in test mode.

It should also be noted that the logical combination of lines CE and T by OR gate 33, followed by control of the enabling of the output buffers 22 by way of AND gate 26, is a relatively simple implementation of this function. Other circuitry, such as delay stages, which control the timing of the enabling and disabling of output buffers 22, or further gate the enabling of output buffers 22 with additional internal signals in memory 1 for other purposes, can of course be included in the implementation of this function according to the particular requirements of the circuit. In addition, while positive logic is shown, it is of course understood that negative logic (i.e., NOR and NAND implementation rather than OR and AND implementation) may equivalently be used in the practice of this invention.

Control of output buffers 22 by the test mode enable signal on line T provides particularly advantageous functions in memory 1 constructed according to this embodiment of the invention. A first function of such construction is that memory 1 can communicate its special test mode status, providing the user (or the interrogating test equipment) acknowledgment that the device is in a special test mode, prior to such time as special test operations are performed. Such acknowledgement is especially important when entry into a special test mode is initiated by extraordinary cycles, such as the overvoltage excursions described hereinabove, as such cycles may not be within the nominal capabilities of the test equipment or system and thus it is not always certain that such cycles are performed as desired. In addition, if a test in a special test mode fails during the manufacturing testing of the device, acknowledgement of entry into test mode allows the test equipment and personnel to not question whether the memory actually failed the test or if it merely failed to enter the test mode. It should be noted that, since the test mode entry procedure may not be in the specifications under which the device is sold, an integrated circuit which fails to enter the special test mode as expected may be fully tested in its normal operating mode, and meet all its specified requirements. Furthermore, communication of the enabling of a special test mode allos detection of the inadvertent entry into such a mode, so that the user may perform the necessary cycles required to return to the normal operating mode of the device.

As noted above, however, the number of external terminals for a packaged integrated circuit device, especially a memory device such as memory 1, are kept to a minimum in order to keep the size of the packaged memory device, and the circuit board space required for the device, as small as possible. Furthermore, it is preferable to require as few connections as possible to the packaged memory device to minimize circuit board complexity. Accordingly, while the status of the integrated circuit may be communicated by a signal presented at a dedicated terminal of the device, the provision of such a terminal, especially for a packaged circuit, is not desirable.

Referring to FIG. 9, the communication of the enabling of a special test mode by terminals DQ will now be described. For purposes of this example, terminal W_ will be presumed to remain at a high logic level, so that the enabling of output buffers 22 is controlled by lines T and CE, and the state of terminal OE. As noted above, the special test modes may be enabled only when memory 1 is not enabled from chip enable terminals E1 and E2, i.e., when line CE at the output of AND gate 25 is at a low logic level. At time $t_0$ in FIG. 9, line T is thus at a low logic level. Also at time $t_0$ in this example, since terminal OE is at a high logic level (as is terminal W_, not shown in FIG. 9), data output terminals DQ are in their active state. The operation of memory 1 upon deselection from terminals E1 and E2 is indicated in FIG. 9, with line CE going to a low logic level at time $t_1$, followed by terminals DQ going to a high impedance state at time $t_2$, as a result of the disabling of output buffers 22 by the operation of AND gate 25, OR gate 33, and AND gate 26. The disabling of output buffers 22, and the resultant high impedance state at terminals DQ, in response to deselection of memory 1 is conventional in memories and other integrated circuits having chip enable functions and terminals.

In memory 1 constructed according to this embodiment of the invention, upon the entry into a special test mode at time $t_3$ of FIG. 9, line T is driven by test mode enable circuitry 29 to a high logic level. Responsive to line T at a high logic level, OR gate 33 will present a high logic level to AND gate 26. Since terminals OE and W_ are at high logic levels, and with line 32 from parallel test circuitry 28 remains high (i.e., the parallel test either passed, or has not taken place), terminals DQ go into an active state at time $t_4$. This condition, where terminals DQ present a low impedance with chip enable terminals E1 and E2 not selecting memory 1, is unexpected in conventional memory operation, as terminals DQ are expected to remain in a high impedance state when the circuit is not enabled. Accordingly, the presentation of a low impedance state at terminals DQ when memory 1 is not enabled acknowledges entry into a special test mode, without requiring additional terminals for memory 1 for such communication.

It should be noted that, for purposes of communicating test mode entry, the data state presented at terminals DQ is unimportant; the entry into test mode is communicated, in this embodiment of the invention, by a low impedance condition at terminals DQ. However, if desired, additional information could be presented at this time at terminals DQ, such additional information including, for example, identification of which test mode has been enabled. In addition, it should be noted that not all of the output buffers in a wide-word memory such as memory 1 need be controlled in the manner described hereinabove, as the enabling of a special test mode can be adequately communicated by a selected one of terminals DQ presenting a low impedance state.

The control of output buffers 22 by test mode enable circuitry 29 allows for a further function of memory 1 in a special operating or test mode. With line T at a high logic level, terminal OE, which serves as an output enable in normal operation, serves a chip enable function in test mode. Such a chip enable function is useful in a test mode, especially if the special test modes are enabled for memories when installed in a system with their terminals DQ connected in wired-OR fashion, for control of the output terminals DQ. In addition, with minimal additional logic in memory 1, the signal from terminal OE during test mode could also control the internal operation of memory 1 during test mode, which would be useful in the system test application.

Referring to FIG. 1, a simple example of such additional logic is illustrated. AND gate 21 receives line T from test mode enable circuitry 29 at one input, and receives the state at output enable terminal OE at another (buffered as desired). The output of AND gate 21 is connected to one input of OR gate 19, which receives line CE from the output of AND gate 25 at its other input. The output of OR gate 19 is connected to such functional circuitry as input/output control and column decoder 16, and serves to enable and disable such circuitry in the conventional chip enable manner. Accordingly, the output enable terminal OE serves not only to control the enabling and disabling of output buffers 22, but also serves as a chip enable terminal during a test mode. Such a function is especially useful if a special operating mode, such as a special test mode, is to be enabled when multiple memories 1 are connected in parallel and only one (or one bank) of memories 1 is to be tested. Since the chip enable terminals E1 and E2 in this embodiment provide exit from test mode, in this embodiment it is especially useful that the output enable terminal OE provide the chip enable control of memory 1. It is contemplated that other embodiments of the logic shown in FIG. 1 for accomplishing such control will now be apparent to those of ordinary skill in the art.

In the example of FIG. 9, at time $t_5$ terminal OE is externally driven to a low logic level when memory 1 is in test mode (line T at a high logic level). Responsive to this signal, the output of AND gate 26 will go to a low logic level, disabling output buffers 22 and placing terminals DQ in a high impedance state, shown at time $t_6$. The re-selection of memory 1 in test mode is accomplished by externally driving terminal OE to a high logic level (shown at time $t_7$), responsive to which terminals DQ again become active and can present data thereat at time $t_8$. As described hereinabove, memory 1 may exit test mode by way of terminals E1 and E2 receiving the chip enable code.

Memory 1 according to this embodiment of the invention thus is capable of communicating its test mode status by using terminals, such as terminals DQ, which have a function in normal operation. In addition, memory 1 according to this embodiment provides a simple method of exiting a special test mode by use of chip enable, and also provides a chip enable function while in the special test mode by using yet another terminal which has a different function in normal operation. Accordingly, the need for additional terminals for the control and acknowledgment of a special test mode is avoided in memory 1 according to the invention.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A static random access memory having a normal operating mode, and having a special operating mode enabled by an enable signal, comprising:

a plurality of memory cells, arranged in rows and columns;

circuitry for accessing at least one of said memory cells in the normal operating mode, responsive to receiving a memory address;

output circuitry, for presenting the contents of the accessed memory cell in the normal operating mode;

a first terminal for receiving pulses of a mode initiate signal indicating entry into the special operating mode; and an enable circuit, having an input coupled to said first terminal, and having an output for presenting said enable signal responsive to receipt, at said first terminal, of a plurality of pulses of said mode initiate signal, circuit also responsive to the first state of said signal at the wherein said enable circuit comprises sequential logic for storing a state indicating the receipt of a single pulse of said mode initiate signal and for not presenting said enable signal responsive to receipt, at said first terminal, of a single pulse of said mode initiate signal, said enable circuit comprising:

a plurality of latch circuits, each clocked responsive to receipt of a pulse of said mode initiate signal, wherein the output of a last one of said latch circuits presents said enable signal, and wherein said plurality of latch circuits are connected in series in such a manner that the last one of said latch circuits presents said enable signal responsive to receipt of a plurality of pulses of said mode initiate signal, wherein each of said plurality of latch circuits have a preferred state on power-up of the circuit in such a manner as to indicate that no pulses of said mode initiate signal have been received.

2. The memory of claim 1, wherein said accessing circuitry and output circuitry are responsive to signals having an amplitude in a range between first and second limits when the circuit is in the normal operating mode;

and wherein said mode initiate signal received at said first terminal comprises a pulse having an amplitude outside of said range.

3. The memory cell of claim 1, further comprising:

a second terminal, for receiving a mode select signal; and an evaluation circuit, for coupling said first and second terminals to said enable circuit by having inputs coupled to said first and second terminals and having an output coupled to said input of said enable circuit, and for presenting a match signal to said enable circuit responsive to the receipt of a pulse of said mode initiate signal in conjunction with said mode select signal.

4. The memory cell of claim 3, wherein said second terminal receives first and second mode select signals, for selecting first and second special operating modes; and wherein said evaluation circuit presents, at its output, first and second match signals responsive to the receipt of a pulse of said mode initiate signal in conjunction with said first and second mode select signals, respectively.

5. The memory of claim 4, wherein said enable circuit comprises:

a first enable circuit, having an input coupled to the output of said evaluation circuit, and having an output for presenting a first enable signal responsive to receipt of a plurality of said first match signals, wherein said first enable circuit comprises sequential logic for storing a state indicating the receipt of a single first match signal and for not presenting said first enable signal responsive to receipt of a single first match signal; and a second enable circuit, having an input coupled to the output of said evaluation circuit, and having an output for presenting a second enable signal responsive to receipt of a plurality of said second match signals, wherein said second enable circuit comprises sequential logic for storing a state indicating the receipt of a single second match signal and for not presenting said second enable signal responsive to receipt of a single second match signal.

6. The memory of claim 5, wherein said first enable circuit comprises:

a plurality of latch circuits clocked responsive to receipt of said first match signals, wherein the output of a last one of said latch circuits presents said first enable signal, and wherein said plurality of latch circuits, are connected in series in such a manner that the last one of said latch circuits presents said first enable signal responsive to receipt of a plurality of said first match signals;

and wherein said second enable circuit comprises:

a plurality of latch circuits clocked responsive to receipt of said second match signals, wherein the output of a last one of said latch circuits presents said second enable signal, and wherein said plurality of latch circuits are connected in series in such a manner that the last one of said latch circuits presents said second enable signal responsive to receipt of a plurality of said second match signals.

7. The memory of claim 6, wherein said accessing circuitry and output circuitry are responsive to signals having an amplitude in a range between first and second limits when the circuit is in the normal operating mode;

and wherein said mode initiate signal received at said first terminal comprises a pulse having an amplitude outside of said range.

8. The memory of claim 7, further comprising:

an overvoltage detection circuit, coupled between said first terminal and said evaluation circuit, for detecting receipt of said mode initiate signal at said first terminal.

9. A static random access memory having a normal operating mode, and having a special operating mode enabled by an enable signal, comprising:

a plurality of memory cells, arranged in rows and columns;

circuitry for accessing at least one of said memory cells in the normal operating mode, responsive to receiving a memory address;

output circuitry, for presenting the contents of the accessed memory cell in the normal operating mode;

a first terminal for receiving pulses of a mode initiate signal indicating entry into a special operating mode; and an enable circuit, having an input coupled to said first terminal, and having an output for presenting said enable signal responsive to receipt, at said first terminal, of a plurality of pulses of said mode initiate signal, wherein said enable circuit comprises sequential logic for storing a state indicating the receipt of a single pulse of said mode initiate signal and for not presenting said enable signal responsive to receipt, at said first terminal, of a single pulse of said mode initiate signal;

wherein said accessing circuitry and output circuitry are responsive to signals having an amplitude in a range between first and second limits when the circuit is in the normal operating mode;

and wherein said mode initiate signal received at said first terminal comprises a pulse having an amplitude outside of said range.

10. The memory of claim 9, further comprising:

an overvoltage detection circuit, coupled between said first terminal and said enable circuit, for detecting receipt of said mode initiate signal at said first terminal.

11. The memory cell of claim 9, further comprising:

a second terminal, for receiving a mode select signal; and an evaluation circuit, for coupling said first and second terminals to said enable circuit by having inputs coupled to said first and second terminals and having an output coupled to said input of said enable circuit, and for presenting a match signal to said enable circuit responsive to the receipt of a pulse of said mode initiate signal in conjunction with said mode select signal.

12. The memory cell of claim 11, wherein said second terminal receives first and second mode select signals, for selecting first and second special operating modes; and wherein said evaluation circuit presents, at its output, first and second match signals responsive to the receipt of a pulse of said mode initiate signal in conjunction with said first and second mode select signals, respectively.

13. The memory of claim 12, wherein said enable circuit comprises:

a first enable circuit, having an input coupled to the output of said evaluation circuit, and having an output for presenting a first enable signal responsive to receipt of a plurality of said first match signals, wherein said first enable circuit comprises sequential logic for storing a state indicating the receipt of a single first match signal and for not presenting said first enable signal responsive to receipt of a single first match signal; and a second enable circuit, having an input coupled to the output of said evaluation circuit, and having an output for presenting a second enable signal responsive to receipt of a plurality of said second match signals, wherein said second enable circuit comprises sequential logic for storing a state indicating the receipt of a single second match signal and for not presenting said second enable signal responsive to receipt of a single second match signal.

14. The memory of claim 13, wherein said first enable circuit comprises:

a plurality of latch circuits clocked responsive to receipt of said first match signals, wherein the output of a last one of said latch circuits presents said first enable signal, and wherein said plurality of latch circuits are connected in series in such a manner that the last one of said latch circuits presents said first enable signal responsive to receipt of a plurality of said first match signals;

and wherein said second enable circuit comprises:

a plurality of latch circuits clocked responsive to receipt of said second match signals, wherein the output of a last one of said latch circuits presents said second enable signal, and wherein said plurality of latch circuits are connected in series in such a manner that the last one of said latch circuits presents said second enable signal responsive to receipt of a plurality of said second match signals.

15. A method for enabling a special operating mode of a static random access memory, comprising:

receiving a plurality of mode initiate pulses at a first terminal of said circuit; and generating a special mode enable signal responsive to receipt of said plurality of mode initiate pulses, wherein said special mode enable signal is not generated responsive to receipt of a single one of said plurality of mode initiate pulses;

wherein, in a normal operating mode, said memory presents the contents of at least one selected memory cell at an output terminal responsive to signals received at said first terminal having an amplitude in a range between first and second limits;

and wherein each of said plurality of mode initiate pulses comprises a signal having an amplitude outside of said range.

16. The method of claim 15, wherein the step of generating the special mode enable signal comprises:

clocking a series of latches responsive to receipt of each of said mode initiate pulses.

17. The method of claim 16, wherein the step of generating the special mode enable signal further comprises:

presenting a data state to the first one of said series of latches so that said data state is clocked into said first one of said series of latches responsive to receipt of a first one of said plurality of mode initiate pulses; and wherein said series of latches are connected in series in such a manner that the last one of said series of latches presents the special mode enable signal at its output after said clocking step has been performed for said plurality of mode initiate pulses.

* * * * *